United States Patent
Yamazaki et al.

(10) Patent No.: US 6,563,482 B1
(45) Date of Patent: May 13, 2003

(54) DISPLAY DEVICE

(75) Inventors: Shunpei Yamazaki, Tokyo (JP); Jun Koyama, Kanagawa (JP); Hirokazu Yamagata, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 88 days.

(21) Appl. No.: 09/619,731

(22) Filed: Jul. 19, 2000

(30) Foreign Application Priority Data

Jul. 21, 1999 (JP) .......................................... 11-206378

(51) Int. Cl.[7] ................................................ G09G 3/36
(52) U.S. Cl. ........................................... 345/87; 345/96
(58) Field of Search ............................... 345/84, 87–89, 345/94, 96–99, 204, 209, 210, 92; 348/790; 349/42, 43, 46, 47

(56) References Cited

U.S. PATENT DOCUMENTS

| | | | |
|---|---|---|---|
| 5,594,569 A | | 1/1997 | Konuma et al. ............. 349/122 |
| 5,643,826 A | | 7/1997 | Ohtani et al. .................. 437/88 |
| 5,648,793 A | * | 7/1997 | Chen |
| 5,923,962 A | | 7/1999 | Ohtani et al. ................ 438/150 |
| 6,243,062 B1 | * | 6/2001 | Den Boer et al. |
| 6,327,008 B1 | * | 12/2001 | Fujiyoshi |
| 6,400,350 B1 | * | 6/2002 | Nishimura et al. |

FOREIGN PATENT DOCUMENTS

| | | |
|---|---|---|
| EP | 938 074 A1 | 8/1999 |
| JP | 7-130652 | 5/1995 |
| JP | 11-167373 | 6/1999 |

OTHER PUBLICATIONS

Inui, S. et al, "Thresholdless Antiferroelectricity in Liquid Crystals and its Application to Displays," *J. Mater Chem.*, vol. 6, No. 4, pp. 671–673, 1996.

Yoshida, T. et al, "A Full Color Thresholdless Antiferroelectric LCD Exhibiting Wide Viewing Angle with Fast Response Time," *SID 97 Digest*, pp. 841–844, 1997.

Furue, H. et al, "Characteristics and Driving Scheme of Polymer–Stabilized Monostable FLCD Exhibiting Fast Response Time and High Contrast Ratio with Gray–Scale Capability," *SID 98 Digest*, pp. 782–785, 1998.

English abstract re Japanese Patent Application No. JP 7–130652, published May 19, 1995.

English abstract re Japanese Patent Application No. JP 11–167373, published Jun. 22, 1999.

* cited by examiner

*Primary Examiner*—Regina Liang
(74) *Attorney, Agent, or Firm*—Cook, Alex, McFarron, Manzo, Cummings & Mehler, Ltd.

(57) ABSTRACT

Display bright in contrast can be obtained without discrination and flicker in the display device of the direct vision type whose pixel pitches are short to 20 μm or less. A liquid crystal panel is driven through the frame inverse driving method, and the vertical frame frequency is set to 120 Hz or more. Also, each of the pixels is arranged to correspond to one of R, G and B of color filters disposed on a TFT substrate side.

40 Claims, 23 Drawing Sheets

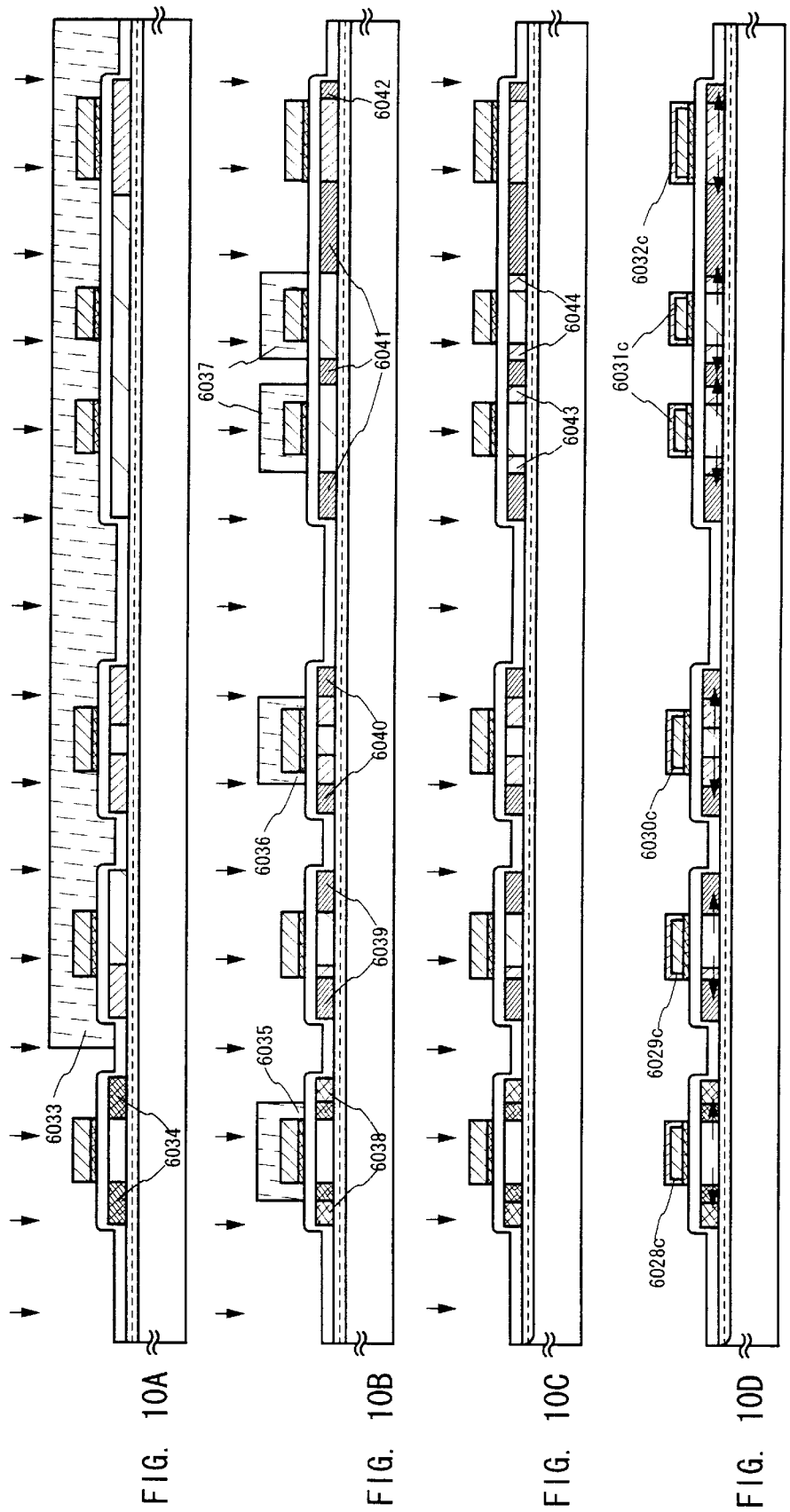

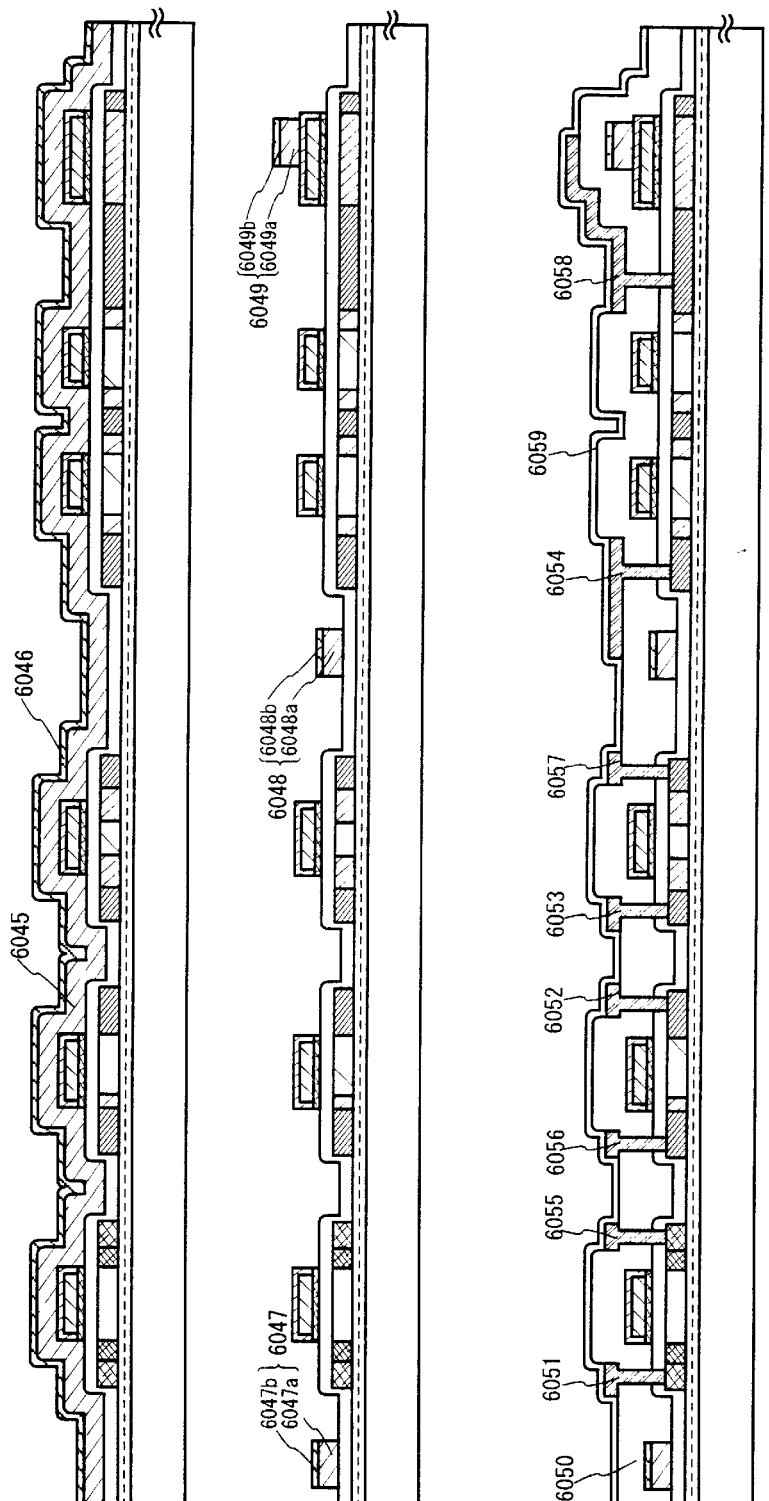

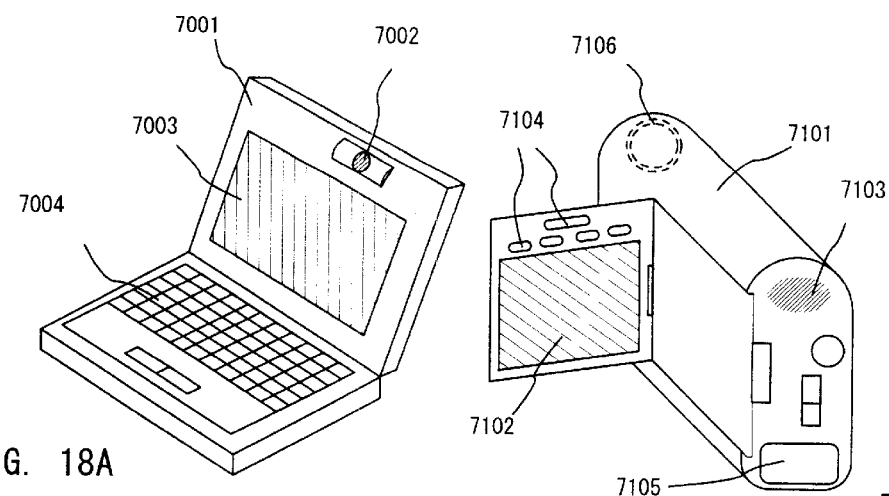
FIG. 18A
FIG. 18B
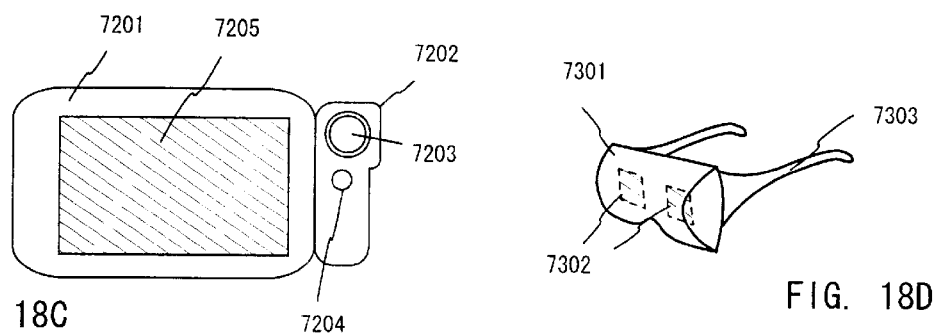
FIG. 18C
FIG. 18D
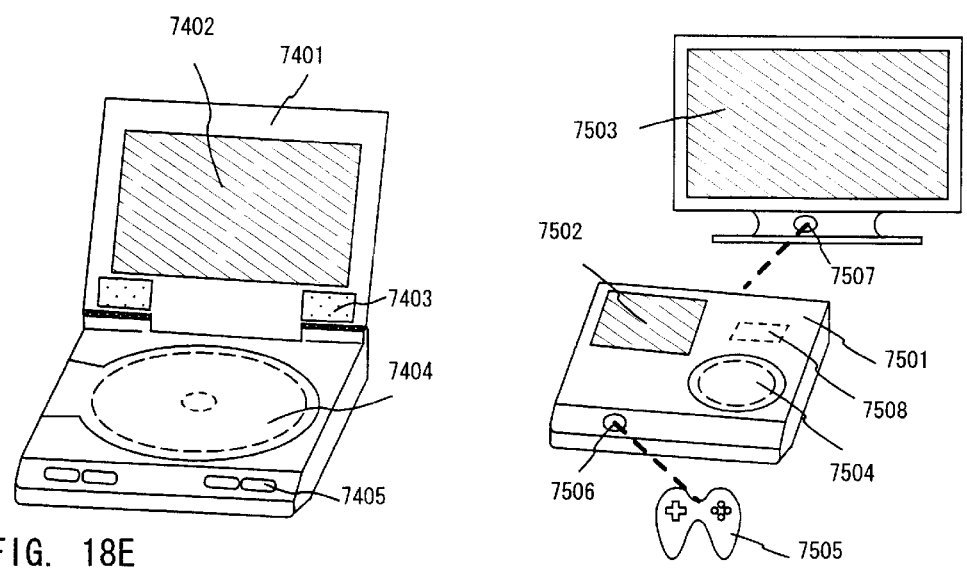
FIG. 18E
FIG. 18F

FIG. 20A
PRIOR ART

| + | − | + | − | + | − |
|---|---|---|---|---|---|
| + | − | + | − | + | − |
| + | − | + | − | + | − |
| + | − | + | − | + | − |

POLARITY PATTERN ①

↔

| − | + | − | + | − | + |
|---|---|---|---|---|---|
| − | + | − | + | − | + |
| − | + | − | + | − | + |
| − | + | − | + | − | + |

POLARITY PATTERN ②

FIG. 20B
PRIOR ART

| + | + | + | + | + | + |
|---|---|---|---|---|---|
| − | − | − | − | − | − |
| + | + | + | + | + | + |
| − | − | − | − | − | − |

POLARITY PATTERN ③

↔

| − | − | − | − | − | − |
|---|---|---|---|---|---|
| + | + | + | + | + | + |
| − | − | − | − | − | − |
| + | + | + | + | + | + |

POLARITY PATTERN ④

FIG. 22A
PRIOR ART
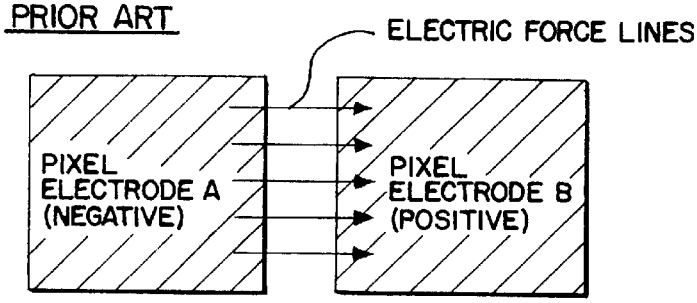
FIG. 22B
PRIOR ART
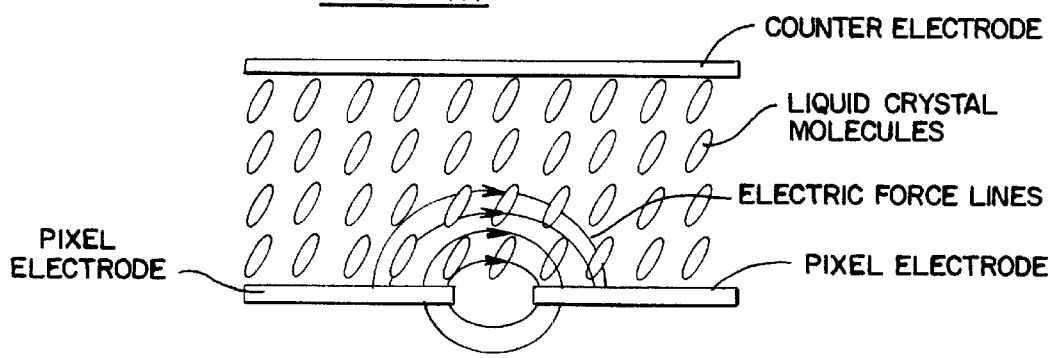
FIG. 22C
PRIOR ART
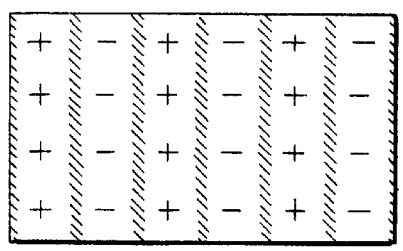 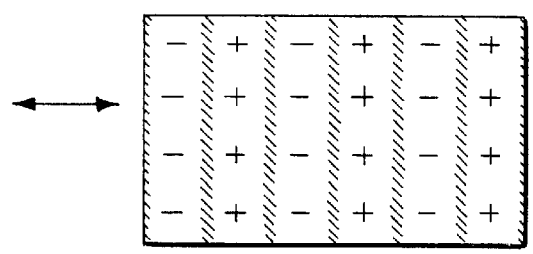
DISCRINATION PATTERN ①     DISCRINATION PATTERN ②

POLARITY PATTERN ⑤

POLARITY PATTERN ⑥

DISPLAY DEVICE

BACKGROUND OF THE INVENTION

1. Field of the Invention

The present invention relates to a driving method suitable for a display device using a display medium such as liquid crystal in which pixels a matrix. Also, the present invention relates to a display device which conducts display by using the driving method. In particular, the present invention relates to an active matrix liquid crystal panel (liquid crystal panel) of the direct vision type.

2. Description of the Related Art

In recent years, a technique by which a semiconductor device in which a semiconductor thin film is formed on an insulating substrate, such as a thin film transistor (TFT), has been rapidly developed. The reason is that the liquid crystal panel (representatively, an active matrix liquid crystal panel) is increasingly demanded.

The active matrix liquid crystal panel is so designed that electric charges going into or out of pixels of several hundred thousands to several millions which are arranged in a matrix are controlled by pixel switching elements, thus displaying an image.

In the present specification, the pixel is directed to an element which is mainly made up of a switching element, a pixel electrode connected to the switching element and a counter electrode so disposed as to be opposed to the pixel electrode through the liquid crystal.

Hereinafter, a description will be given in brief of a representative example of the display operation of the active matrix liquid crystal panel with reference to FIGS. 19A and 19B.

A source signal line driving circuit 103 and source signal lines S1 to S6 are connected to each other. Similarly, a gate signal line driving circuit 104 and gate signal lines G1 to G5 are connected to each other. A plurality of pixels 106 are disposed in a pixel portion 105 surrounded by the source signal lines S1 to S6 and the gate signal lines G1 to G5. Each of the pixels 106 is equipped with a switching element 101 and a pixel electrode 102. The numbers of source signal lines and gate signal lines are not limited to those values (FIG. 19A). FIG. 19B is a diagram showing the positions of the plural elements 106 disposed in the pixel portion 105 (display pattern).

A video signal is supplied to the source signal line S1 in response to a signal from a shift register circuit or the like (not shown) within the source signal line driving, circuit 103. Also, a select signal is supplied to the gate signal line G1 from the gate signal line driving circuit 104, to thereby turn on the switching element 101 of a pixel (1,1) in a portion where the gate signal line G1 and the source signal line S1 cross each other. Then, the video signal is supplied to the pixel electrode of the pixel (1,1) from the source signal line S1. The liquid crystal is driven by the potential of the video signal thus supplied, and the amount of transmitted light is controlled, to thereby display a part of the image on the pixel (1,1) (an image corresponding to the pixel (1,1)).

Subsequently, while a state in which the image is displayed on the pixel (1,1) is maintained by storage capacitors (not shown) or the like, a video signal is supplied into the source signal line S2 in response to a signal from a shift register circuit or the like (not shown) within the source signal line driving circuit 103 on the subsequent instant. In a state where the select signal is continued to be supplied to the gate signal line G1 from the gate signal line driving circuit 104, the switching element 101 of a pixel (1,2) in a portion where the gate signal line G1 and the source signal line S2 cross each other is turned on. Then, the potential of the video signal is applied to the pixel electrode of the pixel (1,2) from the source signal line S2. The liquid crystal is driven by the potential of the video signal thus supplied, and the amount of transmitted light is controlled, to thereby display a part of the image on the pixel (1,2), the same way as the pixel (1,1) (an image corresponding to the pixel (1,2)).

The above display operation is sequentially conducted, and a part of the image is displayed on the pixels (1,1), (1,2), (1,3), (1,4), (1,5) and (1,6) which are connected to the gate signal line G1 in sequence. During this operation, the select signal is continued to be supplied to the gate signal line G1.

Upon supply of the video signal to all of the pixels connected to the gate signal line G1, the select signal is stopped from being supplied to the gate signal line G1, and subsequently the select signal is supplied to only the gate signal line G2. Then, a part of the image is displayed on the pixels (2,1), (2,2), (2,3), (2,4), (2,5) and (2,6) which are connected to the gate signal line G2 in sequence. During this operation, the select signal is continued to be supplied to the gate signal line G2. All of the gate signal lines are subjected to the above display operation, to thereby display one screen (frame) on a display area. This period is called "one frame period" (FIG. 19B).

Until a part of the image is displayed on a pixel (4,6) to which the video signal is finally supplied, all of other pixels retain a state where the image is displayed by the storage capacitors (not shown) or the like.

Those display operation is sequentially repeated, to thereby display the image on the pixel portion 105.

As usual, in the liquid crystal panel using TFTs or the like as the switching elements, in order to prevent a liquid crystal material from being deteriorated, the polarity of the potential of the signal supplied to each of the pixels is inverted (alternating current inverse driving) on the basis of a common potential.

As one inverse driving method, there has been proposed a source line inverse driving method. FIG. 20A shows the polarity pattern of the pixels in the source line inverse driving operation. The polarity pattern shown in FIG. 20 corresponds to the display pattern shown in FIG. 19B.

In FIGS. 20, 22 and 23 showing the polarity pattern, if the potential of the video signal which is supplied to the pixels is positive on the basis of the common potential, the polarity is indicated by "+", whereas if it is negative, the polarity is indicated by "−".

In addition, as a scanning method, there has been proposed an interlace scanning method in which every two gate signal lines of one screen (one frame) are jumped over to conduct the scanning operation twice (two fields), and a non-interlace scanning method in which the scanning operation is conducted in order without jumping over the gate signal lines. In this specification, an example in which the non-interlace scanning method is employed will be mainly described.

As shown in FIG. 20A, the feature of the source line inverse driving operation resides in that, in an arbitrary one-frame period, the video signals of the same polarity are supplied to all of the pixels which are connected to the same source signal line, and the video signals opposite to each other in the polarity are supplied to the pixels connected to the adjacent source signal lines. Then, in a succeeding one-frame period, the video signals opposite in polarity to that of the polarity pattern (1) displayed in a one-frame period immediately before the current one-frame period are supplied to the respective pixels, to thereby display a polarity pattern (2).

Also, as another inverse driving method, there has been proposed a gate line inverse driving method. The polarity pattern of the gate line inverse driving method is shown in FIG. 20B.

As shown in FIG. 20B, in an arbitrary one-frame period, the video signals of the same polarity are supplied to all of the pixels which are connected to the same gate signal line, and the video signals opposite to each other in the polarity are supplied to the pixels connected to the adjacent gate signal lines. Then, in a succeeding one-frame period, the video signals opposite in polarity to that of the polarity pattern (3) displayed in a one-frame period immediately before the current one-frame period are supplied to the respective pixels, to thereby display a polarity pattern (4).

In other words, as in the above conventional source line inverse driving method, the gate line inverse driving method is a driving method in which two sorts of polarity patterns (polarity pattern (3) and polarity pattern (4)) are repeatedly displayed.

In recent years, the liquid crystal panel has been demanded to be made thin. light in weight as well as high in precision, high in image quality and high in luminance.

In order to make the liquid crystal panel thin and light in weight, it is necessary to make the substrate size of the liquid crystal panel small. In order to make the substrate size small while an image quality is not deteriorated, the pixel pitch must be unavoidably shortened to reduce the area of the pixel portion.

FIG. 21 shows an enlarged view of the pixels of the liquid crystal panel. As shown in FIG. 21, there are disposed a source signal line 12a, a gate signal line 12b, a pixel TFT (switching element) 15 having a semiconductor layer 13 and a gate electrode 14 which is formed of a part of the gate signal line 12b, and a pixel electrode 16. Then, a black matrix 17 is disposed on the source signal line 12a, the gate signal line 12b and the pixel TFT 15 so as to cover a region which is not required to transmit a visible light therethrough. The black matrix (BM) is directed to wirings (the source signal line 12a, the gate signal line 12b) which are not required to transmit the visible light, or a light shield film disposed about the pixel TFT 15 and so on.

The pixel pitch L is directed to a shorter distance of a distance between two source signal lines 12a opposed to each other through the pixel 11 or a distance between two gate signal lines 12b opposed to each other. If both of those distances are equal to each other, the distances are regarded as the pixel pitch L.

As the pixel pitch is shorter, a distance between two pixel electrodes 16 provided in the adjacent pixels is also shortened more. For that reason, if the source line inverse driving operation and the gate line inverse driving operation are conducted, stripes called "discrination line" occur between the adjacent pixels to which signals of the inverse polarities are applied, whereby the brightness of the entire display screen tends to be reduced.

The disorder (discrination) of the orientation state of the liquid crystal is caused by a potential difference occurs between a pixel to which a video signal of the positive polarity is supplied and a pixel to which a video signal of the negative polarity is supplied, and a display failure (optical loss in case of normally white, light leakage in case of normally black) caused by the disorder of the orientation state is called "discrination line" in the present specification.

The potential difference occurring between the adjacent pixels is generated by a line of electric force shown in FIG. 22A. FIG. 22A shows a top view of a state of the line of electric force occurring between two pixel electrodes A and B with respect to an effective electric field (positive or negative) perpendicular to a paper surface which is applied to the pixel electrodes A and B provided two adjacent pixels, and FIG. 22B shows a cross-sectional view of FIG. 22A. For convenience, FIG. 22A shows only the line of electric force occurring laterally between the pixel electrodes A and B, and FIG. 22B shows a state view of the line of electric force immediately before the liquid crystal molecules the orientation of which is controlled to a perpendicular direction react on application of the electric field.

The discrination pattern corresponding to FIG. 20A is shown in FIG. 22C. In FIG. 22C, the discrination line is formed at a given position, and the discrination pattern (1) and the discrination pattern (2) are substantially identical with each other although the polarity of the video signal which is supplied to the pixel is different therebetween. The discrination line shown in FIG. 22C is found even in the gate line inverse driving method. In case of the gate line inverse driving method, the discrination line appears between the respective pixels in parallel with the direction of the gate signal lines.

In addition, as another conversion driving method which is not shown, there is has been proposed a method (dot inverse driving method) in which the polarity of the video signal which is supplied to the pixel is inverted among all of the adjacent pixels. In the dot inverse driving method, the adjacent pixels are different in polarity, thereby greatly influencing the potential difference occurring between the adjacent pixels. In particular, the discrination more greatly influences display as the pixel pitch becomes 20 shorter.

As the pixel pitches are shorter, the distances between the adjacent pixel electrodes becomes more shortened. The discrination is particularly remarkable if the distance is 20 μm or less.

Under the above circumstances, there has been proposed that the source line inverse driving method, the gate line inverse driving method and the dot inverse driving method are replaced by a frame inverse driving method in which the polarities of the video signals which are supplied to all the pixels for each one-frame period are inverted, to thereby suppress the discrination.

FIG. 23 shows the polarity pattern of the respective pixels in the frame inverse driving method. The feature of the frame inverse driving method resides in that the video signals of the same polarity are supplied to all of the pixels within an arbitrary one-frame period (polarity pattern (5)), and in a succeeding one-frame period, the polarities of the video signals which are supplied to all of the pixels are inverted to conduct display (polarity pattern (6)). In other words, if attention is paid to only the polarity pattern, the frame inverse driving method is a driving method in which two sorts of polarity patterns (the polarity pattern (5) and the polarity pattern (6)) are repeatedly displayed. For that reason, in the same frame period, the polarities of the video signals which are supplied to the adjacent pixels are identical with each other, and the discrination is suppressed from occurring.

However, the frame inverse driving method suffers from such a problem that because the brightness of a screen is slightly different between display where the polarity of the image signal is positive and display where the polarity of the image signal is negative, an observer observes the display with flicker. The cause for generating the flicker will be described below in detail.

FIG. 24 shows a timing chart of a video signal supplied to the source signal lines S1 to Sn, a select signal supplied to the gate signal line G1, and the potential of a pixel electrode provided in a pixel (1,1). It is assumed that period during which the select signal is supplied to the gate signal line G1 is a one-line period, and a period of since the select signals are supplied to all of the gate signal lines until one image is displayed is a one-frame period.

Upon supply the video signal and the select signal to the source signal line S1 and the gate signal line G1, respectively, the potential of the video signal positive in polarity which is selected by the select signal is applied to the pixel (1,1) disposed in a portion where the source signal line S1 and the gate signal line G1 cross each other. Then, the potential is ideally retained by a storage capacitor or the like for a one-frame period.

However, in fact, upon completion of the one-line period, the select signal is not supplied to the gate signal line G1, and the potential of the gate signal line G1 is changed. Simultaneously, the potential of the pixel electrode is also changed. The gate signal line is connected to the gate electrode of a pixel TFT which is the switching element of the pixel. Then, the source signal line is connected to one of the source region or drain region of the pixel TFT, and the pixel electrode is connected to the other region which is not connected to the source signal line. A small capacitor is formed between the gate electrode and the pixel electrode, and as the potential of the gate signal line G1 changes, the potential of the pixel electrode also changes by $\Delta V$. In this case, the potential of the pixel electrode changes in a negative direction. In the timing chart shown in FIG. 24, the actual potential of the pixel electrode is denoted by a solid line, and the potential of the pixel electrode assuming that no capacitor is formed between the gate electrode and the pixel electrode is denoted by a dotted line.

Subsequently, in a second frame period, the video signal negative in polarity which is opposite to that in the first frame period is supplied to the pixel electrode provided in the pixel (1,1). Upon completion of the one-line period during the second frame period, the select signal is not supplied to the gate signal line G1, and the potential of the gate signal line G1 changes, with which the potential of the pixel electrode also changes by $\Delta V$ in the negative direction.

In other words, assuming that the potential difference between the potential of the pixel electrode and the common potential after completion of the one-line period during the first frame period is V1, and the potential difference between the potential of the pixel electrode and the common potential after completion of the one-line period during the second frame period is V2, a difference of $2 \times \Delta V$ is produced between the potential difference V1 and the potential difference V2. As a result, the brightness of the screen is different between the first frame period and the second frame period.

Similarly, in case of the source line inverse driving method, the gate line inverse driving method and the dot inverse driving method, the brightness of the screen is different between the pixel to which the video signal negative in polarity is supplied and the pixel to which the video signal positive in polarity is supplied. However because the pixels different in brightness are adjacent to each other, it is difficult for the observer to recognize the different brightness. On the contrary, in case of the frame is inverse driving method, the polarities of the adjacent pixels are completely identical with each other, and the polarities are inverted during the one-frame period which is in a frequency band (about 30 Hz) which can be recognized by human's eyes. As a result, that the display when the polarity of the video signal is positive and the display when the polarity of the video signal is negative are slightly different from each other is recognized as flicker by the observer. In particular, the flicker is remarkably recognized in an intermediate tone display.

As described above, in the source line inverse driving method and the gate line inverse driving method, as exemplified by FIGS. 20A and 20B, the polarity pattern (1) and the polarity pattern (2) are repeatedly displayed, and the discrination lines are 25 continuously formed at a given position between the adjacent pixels different in polarity. As a result, the brightness of the screen is reduced. In addition, the same is applied to the dot inverse driving method.

Also, in the frame inverse driving method, although no discrination is generated, flicker occurs.

SUMMARY OF THE MENTION

The present invention has been made to solve the above various problems with the conventional display devices, and therefore an object of thee present invention is to provide a liquid crystal panel short in pixel pitch and a method of driving the liquid crystal panel which are capable of obtaining bright display without flicker.

In order to achieve the above object, according to a first aspect of the present invention, there is provided a display device, comprising:

a first substrate including a plurality of gate signal lines, a plurality of source signal lines and a plurality of pixel electrodes disposed on the respective portions where the gate signal lines and the source signal lines cross each other; and a second substrate including color filters with three colors;

wherein first video signals of the same polarity are supplied to the plurality of pixel electrodes through the plurality of source signal lines during a first frame period; and wherein second video signals of the polarity opposite to that of the first video signal are supplied to the plurality of pixel electrodes through the plurality of source signal lines during a second frame period subsequent to the first frame period.

According to a second aspect of the present invention, there is provided a display device, comprising:

a first substrate including a plurality of gate signal lines, a plurality of source signal lines and a plurality of pixel electrodes disposed on the respective portions where the gate signal lines and the source signal lines cross each other; and a second substrate including color filters with three colors;

wherein video signals of the same polarity are supplied to the plurality of pixel electrodes through the plurality of source signal lines; and wherein the polarity of the video signals changes for each one-frame period.

According to a third aspect of the present invention, there is provided a display device, comprising:

a first substrate including a plurality of gate signal lines, a plurality of source signal lines and a plurality of switching elements disposed on the respective portions where the gate signal lines and the source signal lines cross each other; and a second substrate including color filters with three colors;
wherein video signals of the same polarity are supplied to the plurality of switching elements through the plurality of source signal lines;
wherein select signals which select the video signals are supplied to the plurality of switching elements through the plurality of gate signal lines;
wherein video signals selected by the select signals are supplied to the plurality of pixel electrodes through the plurality of switching elements; and
wherein the polarity of the video signal changes for each one-frame period.

Intervals of the plurality of gate signal lines or the plurality of source signal lines may be set to 20 μm or less.

The length of the first frame period and the second frame period may be set to 8.3 msec or less.

The length of the one-frame period may be set to 8.3 msec or less.

Each of the plurality of switching elements may include a semiconductor layer with a gate electrode, a source region, a drain region and a channel formation region, and an insulating film disposed between the gate electrode and the semiconductor layer, the gate signal lines may be connected to the gate electrodes, and the source signal lines may be connected to the source regions or the drain regions.

Liquid crystal may be disposed between the first substrate and the second substrate.

The plurality of pixel electrodes may correspond to one of the three colors of the color filters.

There is provided a goggle type display having one of the display device.

There is provided a goggle type display having two of the display devices.

There is provided a mobile computer having one of the display device.

There is provided a notebook type personal computer having one of the display device.

There is provided a video camera having one of the display device.

There is provided a DVD player having one of the display device.

There is provided a game machine having one of the display device.

BRIEF DESCRIPTION OF THE DRAWINGS

These and other objects, features and advantages of this invention will become more fully apparent from the following detailed description taken with the accompanying drawings in which:

FIGS. 10A to 10D are cross-sectional views showing a process of manufacturing a TFT in accordance with the present invention:

FIGS. 11A to 11C are cross-sectional views showing a process of manufacturing a TFT in accordance with the present invention;

FIGS. 18A to 18F are diagrams showing electronic devices using the display device of the present invention;

FIGS. 20A and 20B are diagrams showing the polarity patterns of a source line inverse driving method and a gate line inverse driving method, respectively;

FIGS. 22A to 22C are diagrams showing the mechanism by which discrination occurs;

DETAILED DESCRIPTION OF THE PREFERRED EMBODIMENTS

Now, a description will be given in more detail of preferred embodiments of the present invention with reference to the accompanying drawings.

The structure of the present invention will be described as compared with the conventional structure. An example using a non-interlace scanning will be described in the present specification. However, the present invention is not limited to the non-interlace scanning, but may be applied to other scanning systems such as an interlace scanning.

Figure 2:
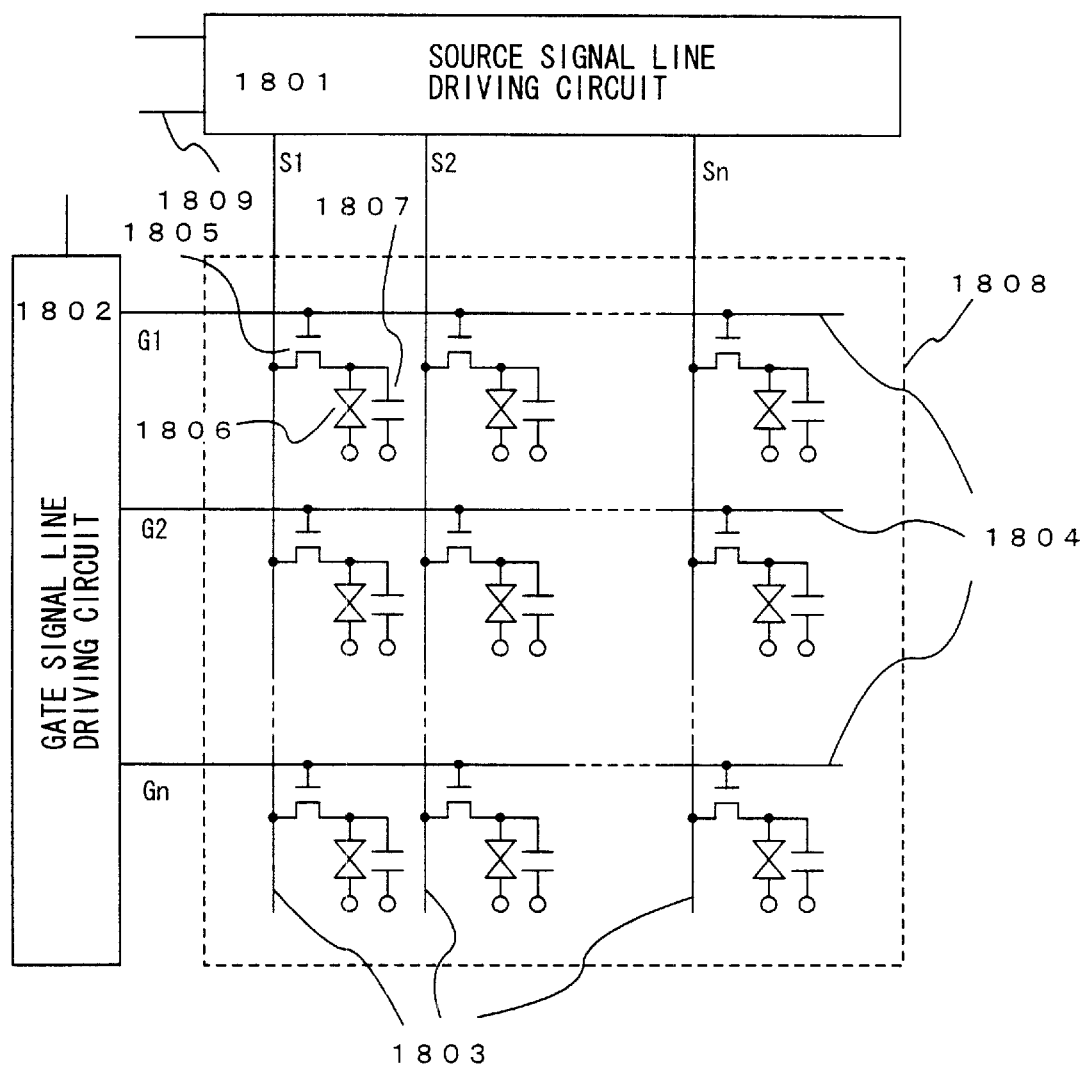
FIG. 2 is a schematic diagram showing a TFT substrate in accordance with the present invention.

FIG. 2 is a diagram showing the structure of an active matrix liquid crystal panel in accordance with the present invention. A source signal line driving circuit 1801 and a gate signal line driving circuit 1802 are generally called "driving circuit". In recent years, the driving circuit may be formed on the same substrate integrally with a pixel portion 808 in which pixels are disposed in a matrix.

Also, in the pixel portion 1808, source signal lines (S1 to Sn) connected to the source signal line driving circuit 1801 and gate signal lines 1804 (G1 to Gn) connected to the gate signal line driving circuit 1802 cross each other. In each of regions surrounded by the source signal lines 1803 and the gate signal lines 1804 are disposed a pixel thin film transistor (pixel TFT) 185, a liquid crystal cell 1806 where liquid crystal is interposed between a counter electrode and a pixel electrode, and a storage capacitor 1807.

A video signal sampled according to a timing signal outputted from the source signal line driving circuit 180 is supplied to the source signal lines 1803.

The pixel TFT 1805 comes to an on-state according to a select signal inputted from the gate signal line driving circuit 1802 through the gate signal lines 1804. Upon turning on the pixel TFT 1805, the video signal supplied to the source signal line 1803 is supplied to the pixel electrode of each the liquid crystal cell 1806.

Figure 1:
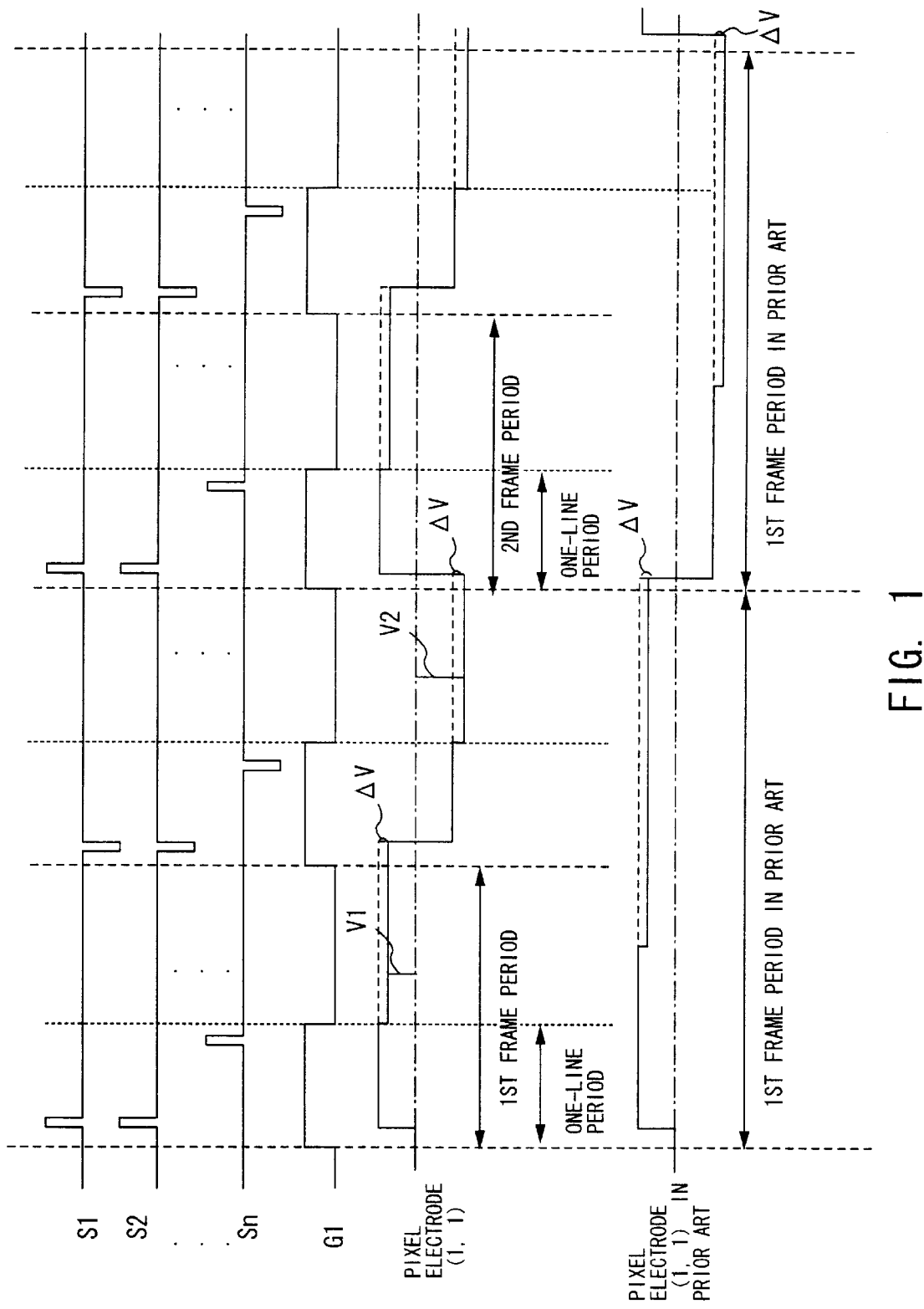
FIG. 1 is a timing chart of a liquid crystal panel in accordance with the present invention.

FIG. 1 shows a timing chart of the video signals supplied to the source signal lines S1, S2 . . . Sn, select signals supplied to the gate signal line G1, and the potential of a pixel electrode provided in a pixel (1,1) on a portion where the source signal line S1 and the gate signal line G1 cross each other, in the liquid crystal panel shown in FIG. 2. FIG. 1 also shows as a conventional example the potential of the pixel electrode provided in the pixel (1,1) of the liquid crystal panel which is driven at a frame frequency of 60 Hz. It is assumed that a period during which the select signal is supplied to the gate signal line G1 is a one-line period, and a period of until the select signals have been supplied to all of the gate signal lines is a one-frame period.

In the present invention, the one-frame period is set to 8.3 msec or less. That is, it is desirable that the frame frequency is set to 120 Hz or more. In this embodiment, the frame frequency is set to 120 Hz.

Upon supply of the video signal and the select signal to the source signal line S1 and the gate signal line G1, respectively, the potential of the video signal positive in polarity which is selected according to the select signal is applied to the pixel (1,1) provided on the portion where the source signal line S1 and the gate signal line G1 cross each other. Then, the potential is ideally retained for a one-frame period by the storage capacitor or the like.

However, in fact, upon completion of the one-line period, the select signal is not supplied to the gate signal line G1, and the potential of the gate signal line G1 is changed. Simultaneously, the potential of the pixel electrode is also changed. The gate signal line is connected to the gate electrode of the pixel TFT which is the switching element of the pixel. Then, the source signal line is connected to one of the source region or drain region of the pixel TFT, and the pixel electrode is connected to the other region which is not connected to the source signal line. A small capacitor is formed between the gate electrode and the pixel electrode, and as the potential of the gate signal line G1 changes, the potential of the pixel electrode also changes by $\Delta V$. In this case, the potential of the pixel electrode changes in a negative direction. In the timing chart shown in FIG. 1, the actual potential of the pixel electrode is denoted by a solid line, and the potential of the pixel electrode assuming that no capacitor is formed between the gate electrode and the pixel electrode is denoted by a dotted line.

Subsequently, in a second frame period, the video signal negative in polarity which is opposite to that in the first frame period is supplied to the pixel electrode provided in the pixel (1,1). Upon completion of the one-line period during the second frame period, the select signal is not supplied to the gate signal line G1, and the potential of the gate signal line G1 changes, with which the potential of the pixel electrode also changes by $\Delta V$ in the negative direction.

In other words, assuming that the potential difference between the potential of the pixel electrode and that of the common potential after completion of the one-line period during the first frame period is V1, and the potential difference between the potential of the pixel electrode and that of the common potential after completion of the one-line period during the second frame period is V2, a difference of $2 \times \Delta V$ is produced between the potential difference V1 and the potential difference V2. As a result, the brightness of the screen is different between the first frame period and the second frame period.

However, if the frame frequency is set to 120 Hz or higher, the difference in the brightness of the screen between the first frame period and the second frame period cannot be recognized by human's eyes. Accordingly, the polarity is inverted for each of the one-frame periods, even if the display when the polarity of the video signal is positive and the display when the polarity of the video signal is negative are slightly different from each other, the difference is not recognized as flicker by the observer.

As described above according to the present invention, since the liquid crystal panel of the direct vision type is driven through the frame inverse driving method, and the frame frequency is set to 120 Hz or more which is a higher speed than that in the conventional device, display bright in contrast can be obtained without discrination and flicker in the display device of the direct vision type whose pixel pitches are short to 20 $\mu$m or less.

Preferred embodiments of the present invention will be described with reference to FIGS. 3 to 18.

Embodiment 1

Figure 3A:
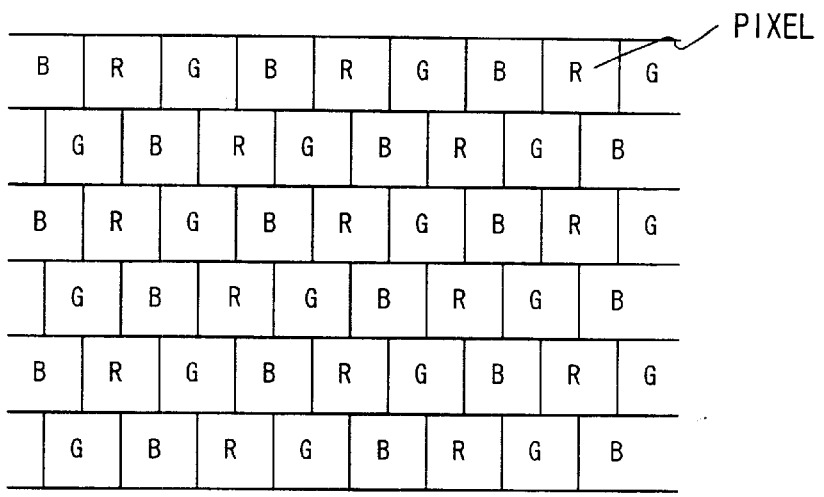
FIGS. 3A and 3B are diagrams showing the arrangement of pixels and color filters in accordance with the present invention.

The arrangement of the pixels and the arrangement of color filters according to the present invention will be described with reference to FIG. 3. In the present invention, the color filters are disposed on a TFT substrate side. A case in which the pixel arrangement of the liquid crystal panel is a delta arrangement will be described with reference to FIG. 3A. The pixels correspond to three colors of R (red), G (green) and B (blue), respectively. One dot is structured by three pixels corresponding to the respective adjacent colors of R (red), G (green) and B (blue).

Figure 3B:
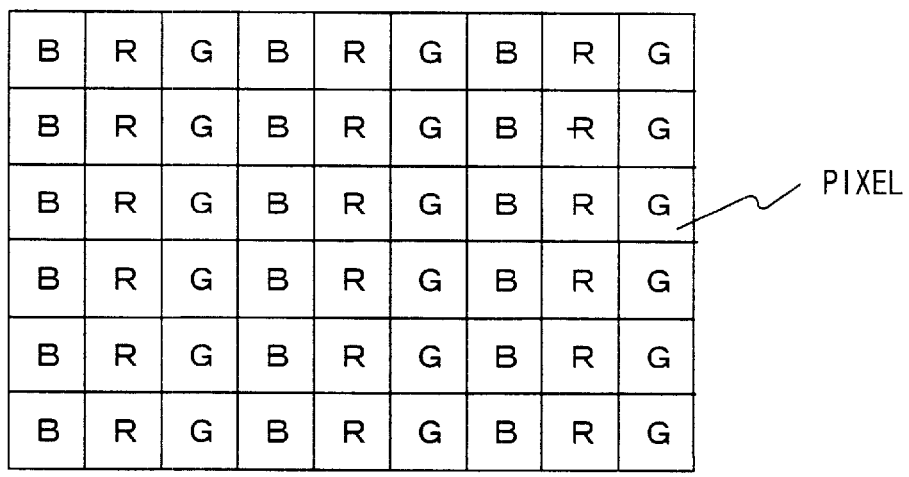

A case in which the pixel arrangement of the liquid crystal panel is a stripe arrangement will be described with reference to FIG. 3B. Each of the pixels corresponds to one of three colors of R (red), G (green) and B (blue). One dot is structured by three pixels corresponding to the respective adjacent colors of R (red), G (green) and B (blue).

Embodiment 2

In this embodiment, an example of a driving circuit used in the present invention will be described.

Figure 4:
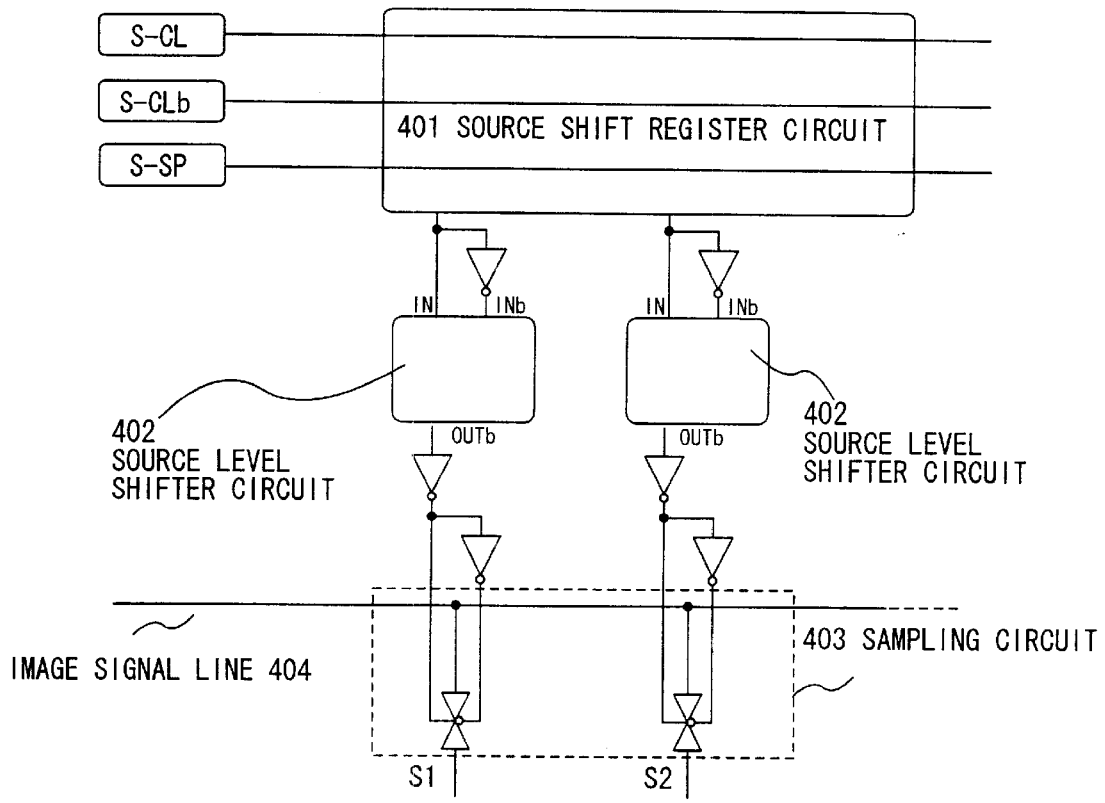
FIG. 4 is a diagram showing an example of a source signal line driving circuit in accordance with the present invention.

FIG. 4 shows an example of a source signal line driving circuit which is one of the liquid crystal panel driving circuits according to the present invention. Input signals inputted from the external of the source signal line driving circuit. in this example, a source clock signal (S-CL) and a signal (S-CLb) resulting from inverting the common potential of the source clock signal (S-CL) are inputted to the source signal line driving circuit.

The source clock signal (S-CL) inputted to the source signal line driving circuit is inputted to a source shift register circuit 401. The source shift register circuit 401 operates in accordance with the inputted source clock signal (S-CL) and a source start pulse signal (S-SP) inputted to the source shift register circuit 401 at the same time, to thereby generate a timing signal for sampling the video signal in order.

The timing signal is inputted to the source level shifter circuit 402, thereby allowing its voltage amplitude level to rise. In the present specification, the voltage amplitude level means the absolute value of a potential difference between the highest potential and the lowest potential of the signals, and the rising of the voltage amplitude level means an increase in the potential difference. Also, the lowering of the voltage amplitude level means a decrease in the potential difference.

The timing signal at which the voltage amplitude level rises is inputted to a sampling circuit 403, and the sampling circuit 403 samples the video signals from video signal line 404 on the basis of the inputted timing signal. The sampled video signals are supplied to the corresponding source signal lines S1 and S2 in order.

Figure 5:
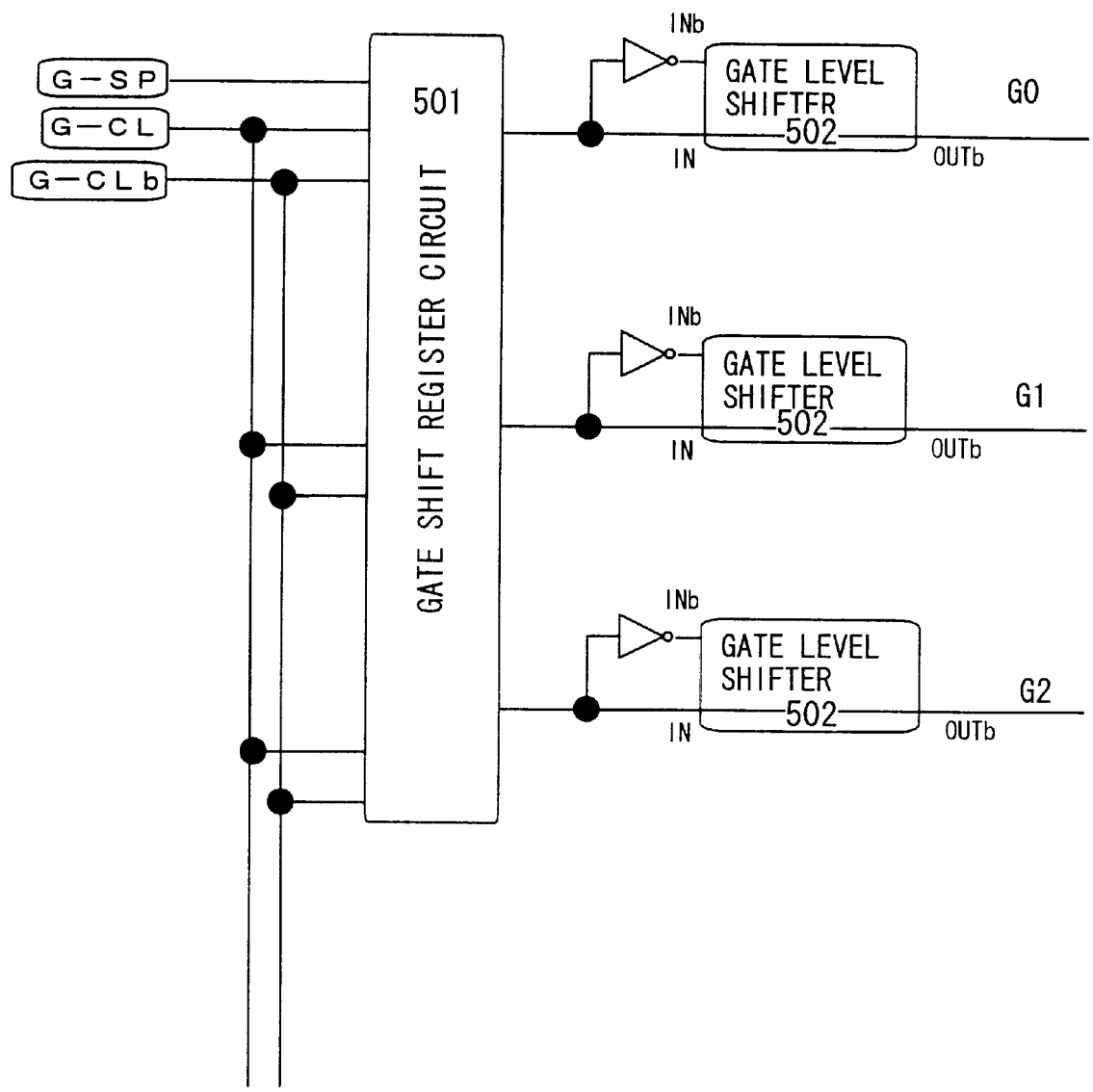
FIG. 5 is a diagram showing an example of a gate signal line driving circuit in accordance with the present invention.

FIG. 5 shows a circuit diagram of the gate signal line driving circuit in accordance with this embodiment. A gate clock signal (G-CL) and a signal (G-CLb) resulting from inverting the common potential of the gate clock signal (G-CL) are inputted to the gate signal line driving circuit from the external of the gate signal line driving circuit.

The gate clock signal (G-CL) inputted to the gate signal line driving circuit is inputted to a gate shift register circuit 501.

The gate shift register circuit 501 generates the select signals for operating all of the pixel TFTs connected to the gate signal lines in order in accordance with the gate clock signal (G-CL) inputted to the gate shift register circuit 501 and a gate start pulse signal (G-SP) inputted to the gate shift register circuit 501 at the same time. The generated select signals are inputted to a gate level shifter circuit 502.

Figure 6A:
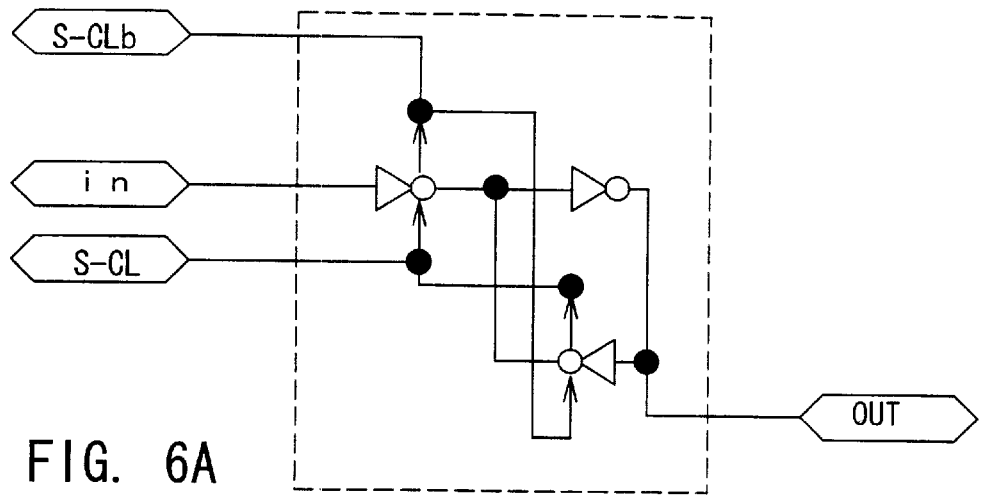
FIGS. 6A and 6B are equivalent circuits showing a shift register circuit and a level shifter circuit, respectively.

The gate level shifter circuit 502 allows the voltage amplitude level of the select signal inputted to the gate level shifter circuit 502 to rise. It is necessary that the select signal is heightened up to the voltage amplitude level required for surely operating all of the pixel TFTs. The select signal whose voltage amplitude level is allowed to rise is inputted to the gate signal lines G0, G1 and G2, and the pixel TFT supplies the video signal to the liquid crystal. FIG. 6A is a circuit diagram showing an example of the shift register circuit (source shift register circuit 401, the gate shift register circuit 501 ) used for each of the driving circuits.

Figure 6B:
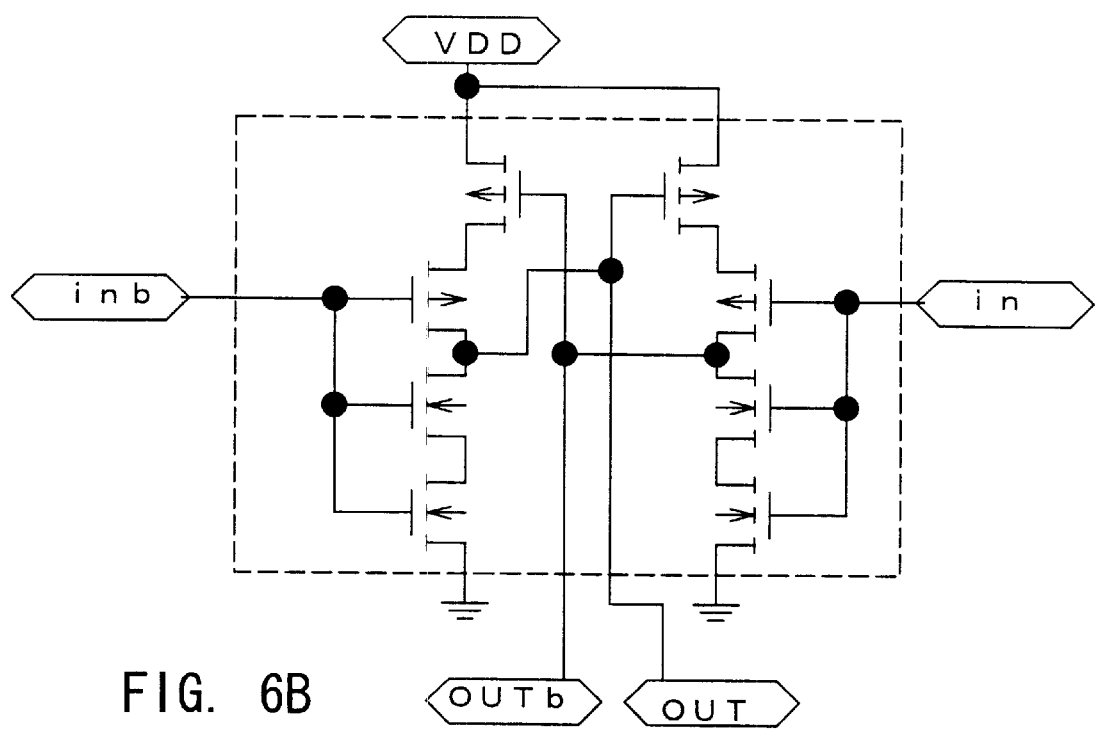

Also, FIG. 6B shows an equivalent circuit diagram of the level shift register (source level shifter circuit 402, gate level shifter circuit 502) used for each of the driving circuits. Reference "in" means that the signal is inputted, and "inb" means that an inverse signal of "in" is inputted. Also, VDD represents a positive voltage. The level shifter circuit is designed such that a signal resulting from making a signal inputted to "in" high in voltage and inverting the signal is outputted from "outb". In other words, if Hi is inputted to "in", a signal of Lo is outputted from "outb" whereas if Lo is inputted thereto, a signal of Hi is outputted from "out".

Embodiment 3

Figure 7:
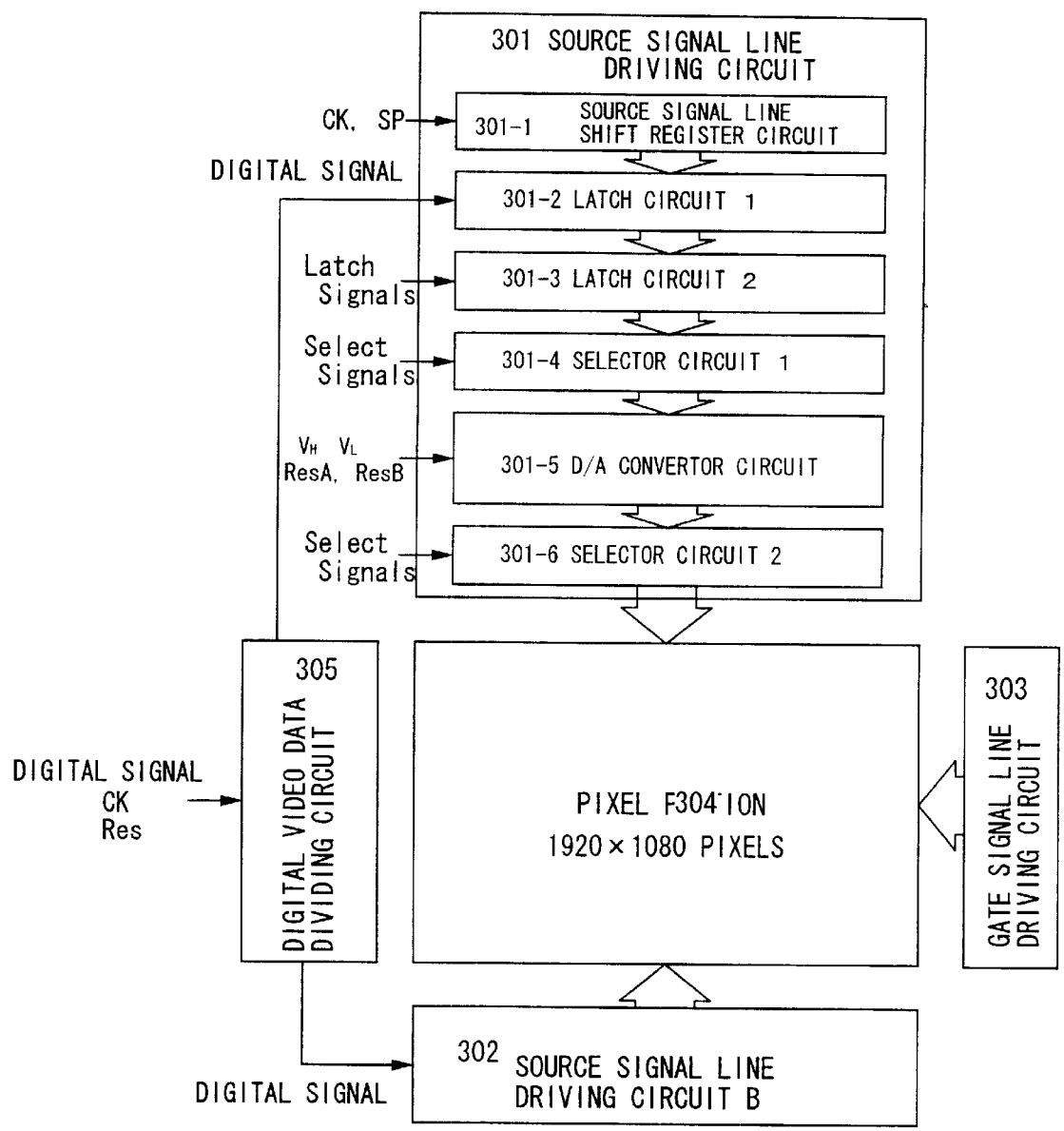
FIG. 7 is a diagram showing a TFT substrate with a digital driving circuit.

In this embodiment, a case in which the TFT substrate has a digital driving circuit will be described with reference to FIG. 7.

A display according to this embodiment includes, on a TFT substrate, a source signal line driving circuit A 301, a source signal line driving circuit B 302, a gate signal line driving circuit 303, a digital video data dividing circuit 305 and a pixel portion 304 where a plurality of pixel TFTs are disposed in a matrix. The source signal line driving circuit B 302 is identical in structure with the source-signal line driving circuit A 301.

The source signal line driving circuit 301 and the gate signal line driving circuit 303 drive the plurality of pixel TFTs disposed in the pixel portion 304. Furthermore, the substrate has an FPC terminal to which various signals are inputted from the external.

The source signal line driving circuit A 301 includes a source signal line side shift register circuit (240 stages ×2 shift register circuits) 301-1, a latch circuit 1 (960×8 digital latch circuits) 301-2, a latch circuit 2 (960×8 digital latch circuits) 301-3, a selector circuit 1 (240 selector circuits) 301-4, a D/A convertor circuit (240 DACs) 301-5, and a selector circuit 2 (240 selector circuits) 301-6. The source signal line driving circuit A 301 may include a buffer circuit or a level shifter circuit (both not shown). Also, for convenience of description, the D/A convertor circuit 301-5 includes a level shifter circuit.

The gate signal line driving circuit 303 includes a shift register circuit, a buffer circuit, a level shifter and so on (they are not shown).

The pixel portion 304 has the pixels of (640×RGB)×1080 (lateral×longitudinal). The pixel TFT is disposed in each of the pixels, and the source region of each the pixel TFT is electrically connected with the source signal line, and the gate electrode thereof is electrically connected to the gate signal line. Also, the drain region of each the pixel TFT is electrically connected with the pixel electrode. Each of the pixel TFTs controls the supply of the video signal (gradient voltage) to the pixel electrode electrically connected to each of the pixel TFTs. The video signal (gradient voltage) is supplied to each of the pixel electrodes, and a voltage is applied to the liquid crystal interposed between the pixel electrode and the counter electrode to drive the liquid crystal.

Hereinafter, the operation of the TFT substrate and a flow of signals according to this embodiment will be described.

First, the operation of the source signal line driving circuit A 301 will be described. For the operation of the source signal line driving circuit B 302, refer to the operation of the source signal line driving circuit A 301.

A clock signal (CK) and a start pulse (SP) are inputted to the source signal line side shift register circuit 301-1. The shift register circuit generates the timing signals in order on the basis of the clock signal (CK) and the start pulse (SP), and then supplies the timing signals to a downstream circuit through the buffer circuit, etc., in sequence.

The timing signals from the source signal line side shift register circuit 301-1 is buffered by the buffer circuit, etc. Because each of the source signal lines to which the timing signal is supplied is connected with a large number of circuits or elements, its load capacitor (parasitic capacitor) is large. In order to prevent the low slope of rising of the timing signal which is caused by the large load capacitor, the buffer circuit is formed.

The timing signal buffered by the buffer circuit is supplied to the latch circuit 1 (301-2). The latch circuit 1 (301-2) includes 960 stages of the latch circuits that process 8-bit digital video data. Upon inputting the timing signal, the latch circuit 1 (301-2) takes the 8-bit digital video data supplied from the digital video data dividing circuit 305 in order and retains the taken data.

A period of time of until the operation of writing the digital video data in the latch circuit in all the stages of the latch circuits 1 (301-2) is completely finished is called "line period". In other words, a time interval of from a time point where the digital video data starts to be written in the latch circuit of the leftmost side stage among the latch circuits 1

(301-2) till a time point where the writing of the digital video data in the latch circuit of the rightmost side stage is completed is a line period. In fact, a period where a horizontal retrace line period is added to the above line period may be called "line period".

After completion of the one-line period, a latch signal is supplied to the latch circuit 2 (301-3) at the operation timing of the source signal line side shift register circuit 301-1. In this moment, the digital video data written and retained in the latch circuit 1 (301-2) is sent out to the latch circuit 2 (301-3) simultaneously, and written and retained in the latch circuits of all the stages in the latch circuit 2 (301-3).

The digital video data supplied from the digital video data dividing circuit is sequentially written in the latch circuit 1 (301-2) that has completely sent out the digital video data to the latch circuit 2 (301-3) on the basis of the timing signal of the source signal line side shift register circuit 301-1.

During a two-round one-line period, the digital video data written and retained in the latch circuit 2 (301-3) is sequentially selected by the selector circuit 1 (301-4) and then supplied to the D/A convertor circuit. In this embodiment, one selector circuit corresponds to four source signal lines in the selector circuit 1 (301-4)

The selector circuit disclosed in Japanese Patent Application No. Hei 9-286098 and Japanese Patent Application Laid-open No. Hei 11-167373 by the present applicant can be employed.

The 8-bit digital video data from the latch circuit 2 (301-3) selected by the selector circuit is supplied to the D/A convertor circuit.

The D/A convertor circuit converts the 8-bit digital video data to the video signals (gradient voltage) and sequentially supplies the video signals to the source signal lines selected by the selector circuit 2 (301-6).

The video signal supplied to the source signal line is supplied to the source region of the pixel TFT in the pixel portion connected to the source signal line.

In the gate signal line driving circuit 303, the timing signal (scanning signal) from the shift register is supplied to the buffer circuit and supplied to the corresponding gate signal line (gate signal line). The gate signal line is connected with the gate electrodes of the pixel TFTs for one line, and since all of the pixel TFTs for one line must be turned on at the same time, the buffer circuit large in current capacity is employed.

As described above, the corresponding pixel TFT is switched in accordance with the scanning signal from the gate signal line driving circuit 303, and the video signals (gradient voltage) from the source signal line driving circuit A 301 and the source signal line driving circuit B 302 are supplied to the pixel TFT to drive the liquid crystal molecule.

The digital video data dividing circuit (SPC: serial-to-parallel conversion circuit) 305 is a circuit for dropping the frequency of the digital video data inputted from the external to 1/x(1<x). If the digital video data inputted from the external is divided, the frequency of the signal necessary for the operation of the driving circuit can also be dropped to 1/x.

Embodiment 4

Here, the method of fabricating on one and the same substrate pixel TFTs for the pixel portion and TFTs of driving circuits (a source signal line driver circuit, a gate signal line driver circuit, a D/A converter circuit, digital video data time ratio gray scale processing circuit and the like) provided in the periphery of the pixel portion will be described in detail in accordance with the fabricating steps. However, in order to simplify the description, CMOS circuits that are the basic circuits of a shift resister circuit, a buffer circuit, a D/A converter circuit and the like and n-channel TFTs will be shown in the drawings.

Figure 8A:
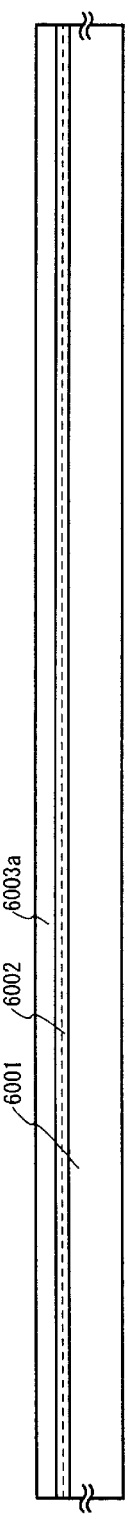
FIGS. 8A to 8D are cross-sectional views showing a process of manufacturing a TFT in accordance with the present invention.

In FIG. 8A, a low-alkaline glass substrate or a quartz substrate can be used as a substrate (TFT substrate) 6001. SOI substrates such as a Smart-Cut, SIMOX, ELTRAN, etc., may be used in the present invention. In this embodiment, a low-alkaline glass substrate was used. In this case, a heat treatment at a temperature lower by about 10 to 20° C. than the strain point of glass may be performed in advance. On the surface of this substrate 6001 on which TFTs are to be formed, a base film 6002 such as a silicon oxide film, a silicon nitride film or a silicon oxynitride film is formed in order to prevent the diffusion of impurities from the substrate 6001. For example, a laminate is formed from a silicon oxynitride film which is fabricated from $SiH_4$, $NH_3$, $N_2O$ by, e.g., by plasma CVD into 100 nm thickness and a silicon oxynitride film which is similarly fabricated from $SiH_4$ and $N_2O$ are into 200 nm.

Figure 8B:
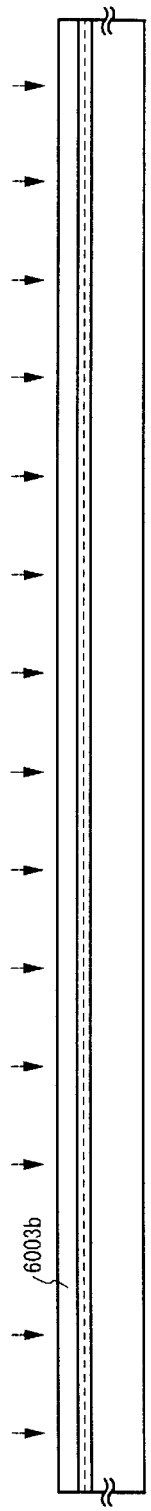

Next, a semiconductor film 6003a that has an amorphous structure and a thickness of 20 to 150 nm (preferably, 30 to 80 nm) is formed by a known method such as plasma CVD or sputtering. In this embodiment, an amorphous silicon film was formed to a thickness of 55 nm by plasma CVD. As semiconductor films which have an amorphous structure, there are an amorphous semiconductor film and a microcrystalline semiconductor film; and a compound semiconductor film with an amorphous structure such as an amorphous silicon germanium film may also be applied. Further, the base film 6002 and the amorphous silicon film 6003a can be formed by the same deposition method, so that the two films can be formed in succession. By not exposing the base film to the atmospheric air after the formation of the base film, the surface of the base film can be prevented from being contaminated, as a result of which the dispersion in characteristics of the fabricated TFTs and the variation in the threshold voltage thereof can be reduced. (FIG. 8A) Then, by a known crystallization technique, a crystalline silicon film 6003b is formed from the amorphous silicon film 6003a. For example, a laser crystallization method or a thermal crystallization method (solid phase growth method) may be applied. It is also acceptable to use a continuous oscillation excimer laser on laser crystallization. Here, in accordance with the technique disclosed in Japanese Patent Application Laid-Open No. Hei 7-130652, the crystalline silicon film 6003b was formed by the crystallization method using a catalytic element. It is preferred that prior to the crystallization step, heat treatment is carried out at 400 to 500° C. for about one hour though it depends on the amount of hydrogen contained, so that, after the amount of hydrogen contained is reduced to 5 atomic % or less, the crystallization is carried out. The atoms are subjected to re-configuration to become dense when an amorphous silicon film is crystallized; and therefore, the thickness of the crystalline silicon film fabricated is reduced by about 1 to 15% than the initial thickness of the amorphous silicon film (55 nm in this embodiment). (FIG. 8B)

Figure 8C:
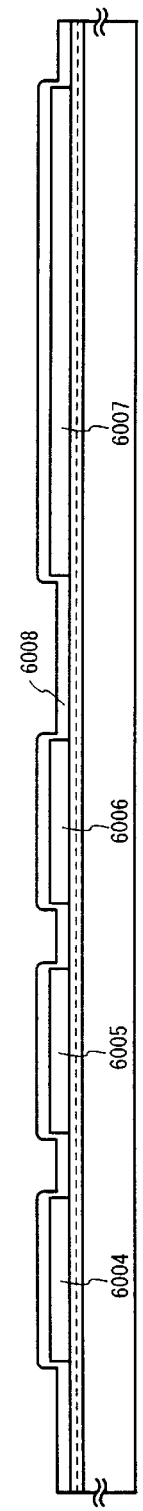

Then, the crystalline silicon film 6003b is divided into islands, whereby island semiconductor layers 6004 to 6007 are formed. Thereafter, a mask layer 6008 of a silicon oxide film is formed to a thickness of 50 to 100 nm by plasma CVD or sputtering. (FIG. 8C)

Then, a resist mask 6009 is provided, and, into the entire surfaces of the island semiconductor layers 6005 to 6007 forming the n-channel type TFTs, boron (B) was added as an impurity element imparting p-type conductivity, at a concentration of about $1\times10^{16}$ to $5\times10^{17}$ atoms/cm$^3$, for the purpose of controlling the threshold voltage. The addition of boron (B) may be effected either by ion doping or it may be added simultaneously when the amorphous silicon film is formed. The addition of boron (B) here was not always necessary, however, the formation of semiconductor layers 6010 to 6012 into which boron was added was preferable for maintaining the threshold voltage of the n-channel type TFTs within a prescribed range. (FIG. 8D)

In order to form the LDD regions of the n-channel type TFTs in the driving circuit, an impurity element imparting n-type conductivity is selectively added to the island semiconductor layers 6010 and 6011. For this purpose, resist masks 6013 to 6016 were formed in advance. As the impurity element imparting the n-type conductivity, phosphorus (P) or arsenic (As) may be used; here, in order to add phosphorus (P), ion doping using phosphine (PH$_3$) was applied. The concentration of phosphorus (P) in the impurity regions 6017 and 6018 thus formed may be set within the range of from $2\times10^{16}$ to $5\times10^{19}$ atoms/cm$^3$. In this specification, the concentration of the impurity element contained in the thus formed impurity regions 6017 to 6019 imparting n-type conductivity is represented by (n$^-$). Further, the impurity region 6019 is a semiconductor layer for forming the storage capacitor of the pixel matrix circuit; into this region, phosphorus (P) was also added in the same concentration. (FIG. 9A)

Figure 8D:
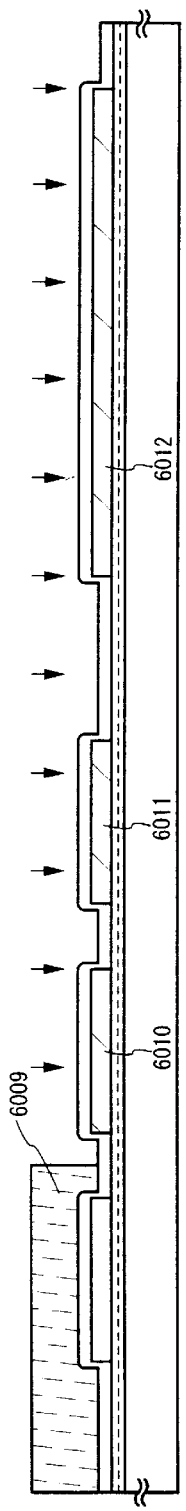
Figure 9A:
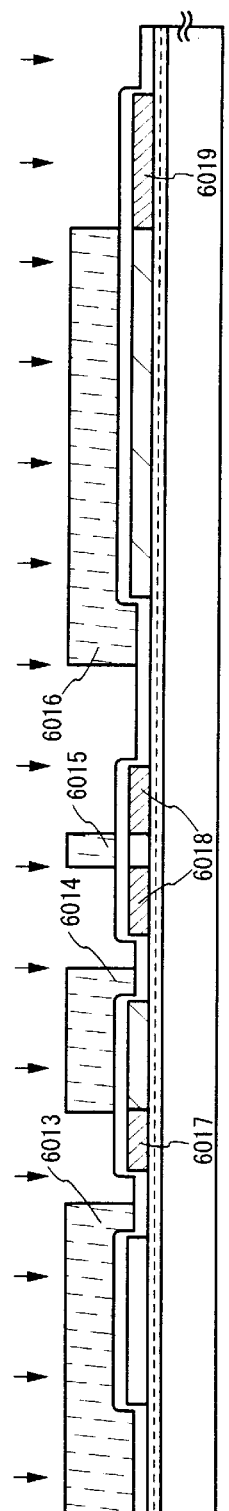
FIGS. 9A to 9D are cross-sectional views showing a process of manufacturing a TFT in accordance with the present invention.

Next, the mask layer 6008 is removed by hydrofluoric acid or the like, and the step of activating the impurity elements added in the steps shown in FIG. 8D and FIG. 9A is carried out. The activation can be carried out by performing heat treatment in a nitrogen atmosphere at 500 to 600° C. for 1 to 4 hours or by using the laser activation method. Further, both methods may be jointly performed. In this embodiment, the laser activation method was employed, and a KrF excimer laser beam (with a wavelength of 248 nm) was used to form a linear beam; and scan was carried out under the condition that the oscillation frequency was 5 to 50 Hz, the energy density was 100 to 500 mJ/cm$^2$, and the overlap ratio of the linear beam was 80 to 98%, whereby the whole substrate surface on which the island semiconductor layers were formed was treated. There is no item of the laser irradiation condition that is subjected to limitation, so that the operator may suitably select the condition. Further, activation may be performed by using excimer laser of continuous light emitting type.

Figure 9B:
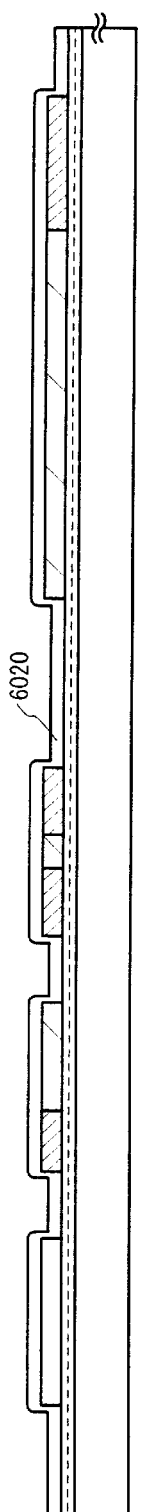

Then, a gate insulating film 6020 is formed from an insulating film comprising silicon to a thickness of 10 to 150 nm, by plasma CVD or sputtering. For example, a silicon oxynitride film is formed to a thickness of 120 nm. As the gate insulating film, another insulating film comprising silicon may be used as a single layer or a laminate structure. (FIG. 9B)

Next, in order to form a gate electrode, a first conductive layer is deposited. This first conductive layer may be comprised of a single layer but may also be comprised of a laminate consisting of two or three layers. In this embodiment, a conductive layer (A) 6021 comprising a conductive metal nitride film and a conductive layer (B) 6022 comprising a metal film are laminated. The conductive layer (B) 6022 may be formed of an element selected from among tantalum (Ta), titanium (Ti), molybdenum (Mo) and tungsten (W) or an alloy comprised mainly of the above-mentioned element, or an alloy film (typically, an Mo—W alloy film or an Mo—Ta alloy film) comprised of a combination of the above-mentioned elements, while the conductive layer (A) 6021 is formed of a tantalum nitride (TaN) film, a tungsten nitride (WN) film, a titanium nitride (TiN) film, or a molybdenum nitride (MoN) film. Further, as the substitute materials of the conductive film (A) 6021, tungsten silicide, titanium silicide, and molybdenum silicide may also be applied. The conductive layer (B) 6022 may preferably have its impurity concentration reduced in order to decrease the resistance thereof; in particular, as for the oxygen concentration, the concentration may be set to 30 ppm or less. For example, tungsten (W) could result in realizing a resistivity of 20 $\mu\Omega$cm or less by rendering the oxygen concentration thereof to 30 ppm or less.

Figure 9C:
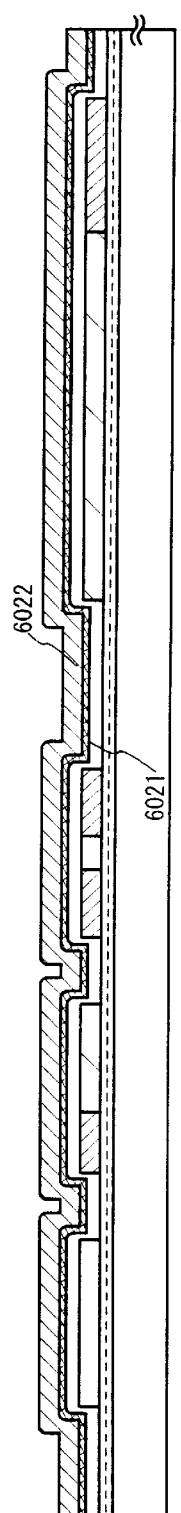

The conductive layer (A) 6021 may be set to 10 to 50 nm (preferably, 20 to 30 nm), and the conductive layer (B) 6022 may be set to 200 to 400 nm (preferably, 250 to 350 nm). In this embodiment, as the conductive layer (A) 6021, a tantalum nitride film with a thickness of 30 nm was used, while, as the conductive layer (B) 6022, a Ta film with a thickness of 350 nm was used, both films being formed by sputtering. In case of performing sputtering here, if a suitable amount of Xe or Kr is added into the sputtering gas Ar, the internal stress of the film formed is alleviated, whereby the film can be prevented from peeling off. Though not shown, it is effective to form a silicon film, into which phosphorus (P) is doped, to a thickness of about 2 to 20 nm underneath the conductive layer (A) 6021. By doing so, the adhesiveness of the conductive film formed thereon can be enhanced, and at the same time, oxidation can be prevented. In addition, the alkali metal element slightly contained in the conductive film (A) 6021 or the conductive film (B) 6022 can be prevented from diffusing into the gate insulating film 6020. (FIG. 9C)

Figure 9D:
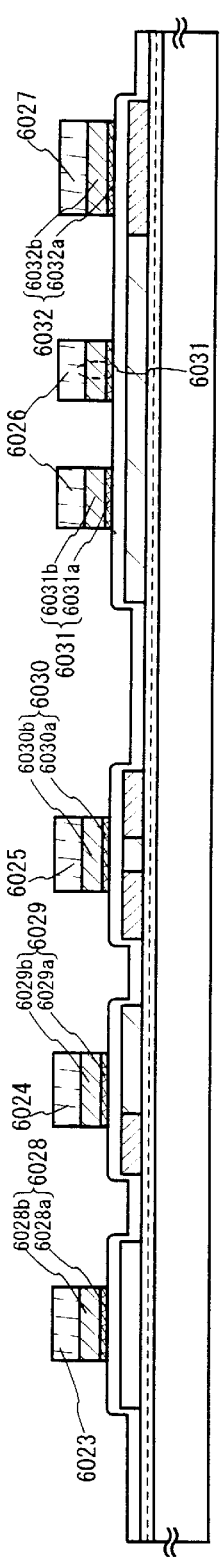

Next, resist masks 6023 to 6027 are formed, and the conductive layer (A) 6021 and the conductive layer (B) 6022 are etched together to form gate electrodes 6028 to 6031 and a capacitor wiring 6032. The gate electrodes 6028 to 6031 and the capacitor wiring 6032 are formed in such a manner that the layers 6028a to 6032a comprised of the conductive layer (A) and the layers 6028b 5o 6032b comprised of the conductive layer (B) are formed as one body respectively. In this case, the gate electrodes 6029 and 6030 formed in the driving circuit are formed so as to overlap the portions of the impurity regions 6017 and 6018 through the gate insulating film 6020. (FIG. 9D)

Then, in order to form the source region and the drain region of the p-channel type TFT in the driving circuit, the step of adding an impurity element imparting p-type conductivity is carried out. Here, by using the gate electrode 6028 as a mask, impurity regions are formed in a self-alignment manner. In this case, the region in which the n-channel type TFT will be formed is covered with a resist mask 6033 in advance. Thus, impurity regions 6034 were formed by ion doping using diborane (B$_2$H$_6$). The concentration of boron (B) in this region is brought to $3\times10^{20}$ to $3\times10^{21}$ atoms/cm$^3$. In this specification, the concentration of the impurity element imparting p-type contained in the impurity regions 6034 is represented by (p$^+$). (FIG. 10A)

Next, in the n-channel type TFTs, impurity regions that functioned as source regions or drain regions were formed. Resist masks 6035 to 6037 were formed, and an impurity element for imparting the n-type conductivity was added to form impurity regions 6038 to 6042. This was carried out by ion doping using phosphine (PH$_3$), and the phosphorus (P) concentration in these regions was set to $1\times10^{20}$ to $1\times10^{21}$ atoms/cm$^3$. In this specification, the concentration of the impurity element imparting the n-type contained in the impurity regions 6038 to 6042 formed here is represented by (n+). (FIG. 10B)

In the impurity regions 6038 to 6042, the phosphorus (P) or boron (B) that are added in the preceding steps are contained, however, as compared with this impurity element concentration, phosphorus is added here at a sufficiently high concentration, so that the influence by the phosphorus (P) or boron (B) added in the preceding steps need not be taken into consideration. Further, the concentration of the phosphorus (P) that is added into the impurity regions 6038 is ½ to ⅓ of the concentration of the boron (B) added in the step shown in FIG. 10A; and thus, the p-type conductivity was secured, and no influence was exerted on the characteristics of the TFTs.

Then, the step of adding an impurity imparting n-type for formation of the LDD regions of the n-channel type TFT in the pixel matrix circuit was carried out. Here, by using the gate electrode 6031 as a mask, the impurity element for imparting n-type was added in a self-alignment manner. The concentration of phosphorus (P) added was $1\times10^{16}$ to $5\times10^{18}$ atoms/cm$^3$; by thus adding phosphorus at a concentration lower than the concentrations of the impurity elements added in the steps shown in FIG. 9A, FIG. 10A and FIG. 10B, only impurity regions 6043 and 6044 were substantially formed. In this specification, the concentration of the impurity element for imparting the n conductivity type contained in these impurity regions 6043 and 6044 is represented by (n−−). (FIG. 10C)

Thereafter, in order to activate the impurity elements, which were added at their respective concentrations for imparting n-type or p-type conductivity, a heat treatment step was carried out. This step can be carried out by furnace annealing, laser annealing or rapid thermal annealing (RTA). Here, the activation step was performed by furnace annealing. Heat treatment is carried out in a nitrogen atmosphere with an oxygen concentration of 1 ppm or less, preferably 0.1 ppm or less, at 400 to 800° C., generally at 500 to 600° C.; in this embodiment, the heat treatment was carried out at 550° C. for 4 hours. Further, in the case a substrate such as a quartz substrate which has heat resistance is used as the substrate 6001, the heat treatment may be carried out at 800° C. for one hour; in this case, the activation of the impurity elements and the formation of junctions between the impurity regions into which the impurity element was added and the channel-forming region could be performed well.

By this heat treatment, on the metal films 6028b to 6032b which form the gate electrodes 6028 to 6031 and the capacitor wiring 6032, conductive layers (C) 6028c to 6032c are formed with a thickness of 5 to 80 nm as measured from the surface. For example, in the case the conductive layers (B) 6028b to 6032b are made of tungsten (W), tungsten nitride (WN) is formed; in the case of tantalum (Ta), tantalum nitride (TaN) can be formed. In the present invention a laminate of a silicon (Si) film, a WN film and a W film; a laminate of a W film and a W containing Si; a laminate of a W film, a W film containing Si and a Si film; a W film containing Mo; or a Ta film containing Mo; may also be used as the gate electrode. Further, the conductive layers (C) 6028c to 6032c can be similarly formed by exposing the gate electrodes 6028 to 6031 to a plasma atmosphere containing nitrogen which plasma atmosphere uses nitrogen or ammonia. Further, heat treatment was carried out in an atmosphere containing 3 to 100% of hydrogen at 300 to 450° C. for 1 to 12 hours, thus performing the step of hydrogenating the island semiconductor layers. This step is a step for terminating the dangling bonds of the semiconductor layers by the thermally excited hydrogen. As another means for the hydrogenation, plasma hydrogenation (using the hydrogen excited by plasma) may be performed.

In the case the island semiconductor layers were fabricated by the crystallization method using a catalytic element from an amorphous silicon film, a trace amount of the catalytic element remained in the island semiconductor layers. Of course, it is possible to complete the TFT even in such a state however, it was more preferable to remove the residual catalytic element at least from the channel-forming region. As one of the means for removing this catalytic element, there was the means utilizing the gettering function of phosphorus (P). The concentration of phosphorus (P) necessary to perform gettering is at the same level as that of the impurity region (n−) which was formed in the step shown in FIG. 10B; by the heat treatment at the activation step carried out here, the catalytic element could be gettered from the channel-forming region of the n-channel type and the p-channel type TFTs. (FIG. 10D)

After the activation and hydrogenation steps are over, a second conductive film is formed as gate wiring. This second conductive film is preferably formed of a conductive layer (D) 6045 comprised mainly of aluminum (Al) or copper (Cu) that is a low resistance material, and a conductive layer (E) 6046 comprised of titanium (Ti), tantalum (Ta), tungsten (W), or molybdenum (Mo). In this embodiment, the second conductive film was formed by using, as the conductive layer (D) 6045, an aluminum (Al) film containing 0.1 to 2 wt % of titanium (Ti) and by using a titanium (Ti) film as the conductive layer (E) 6046. The conductive layer (D) 6045 may be formed to a thickness of 200 to 400 nm (preferably, 250 to 350 nm), while the conductive layer (E) 6046 may be formed to a thickness of 50 to 200 nm (preferably, 100 to 150 nm). (FIG. 11A)

Then, in order to form gate wirings connected to the gate electrodes, the conductive layer (E) 6046 and the conductive layer (D) 6045 were etched, whereby gate wirings 6047 and 6048 and a capacitor wiring 6049 were formed. The etching treatment was carried out in such a manner that, at first, by dry etching using a mixture gas consisting of SiCl$_4$, Cl$_2$ and BCl$_3$, the portions extending from the surface of the conductive layer (E) 6046 to a part of the way of the conductive layer (D) 6045 were removed, and, thereafter, the conductive layer (D) 6045 was removed by wet etching using a phosphoric acid etching solution, whereby the gate wirings could be formed. maintaining a selective workability with respect to the base film. (FIG. 11B)

A first interlayer insulating film 6050 is formed of a silicon oxide film or a silicon oxynitride film with a thickness of 500 to 1500 nm, and contact holes reaching the source regions or the drain regions, which are formed in the respective island semiconductor layers, are formed; and source wirings 6051 to 6054 and drain wirings 6055 to 6058 are formed. Though not shown, in this embodiment these electrodes were formed from a three-layer structure which was constituted by continuously forming a Ti film with a thickness of 100 nm, an aluminum film containing Ti and is having a thickness of 300 nm, and a Ti film with a thickness of 150 nm by sputtering.

Next, as a passivation film 6059, a silicon nitride film, a silicon oxide film or a silicon oxynitride film is formed to a thickness of 50 to 500 nm (typically, 100 to 300 nm). In the case that a hydrogenating treatment was carried out in this state, a desirable result was obtained in respect of the enhancement in characteristics of the TFTs. For example, it is preferable to carry out heat treatment in an atmosphere containing 3 to 100% of hydrogen at 300 to 450° C. for 1 to 12 hours; or, in the case that the plasma hydrogenation method was employed, a similar effect was obtained. Here, openings may be formed in the passivation film 6059 at the positions at which contact holes for connecting the pixel electrodes and drain wirings to each other will be formed later. (FIG. 11C)

Figure 12:
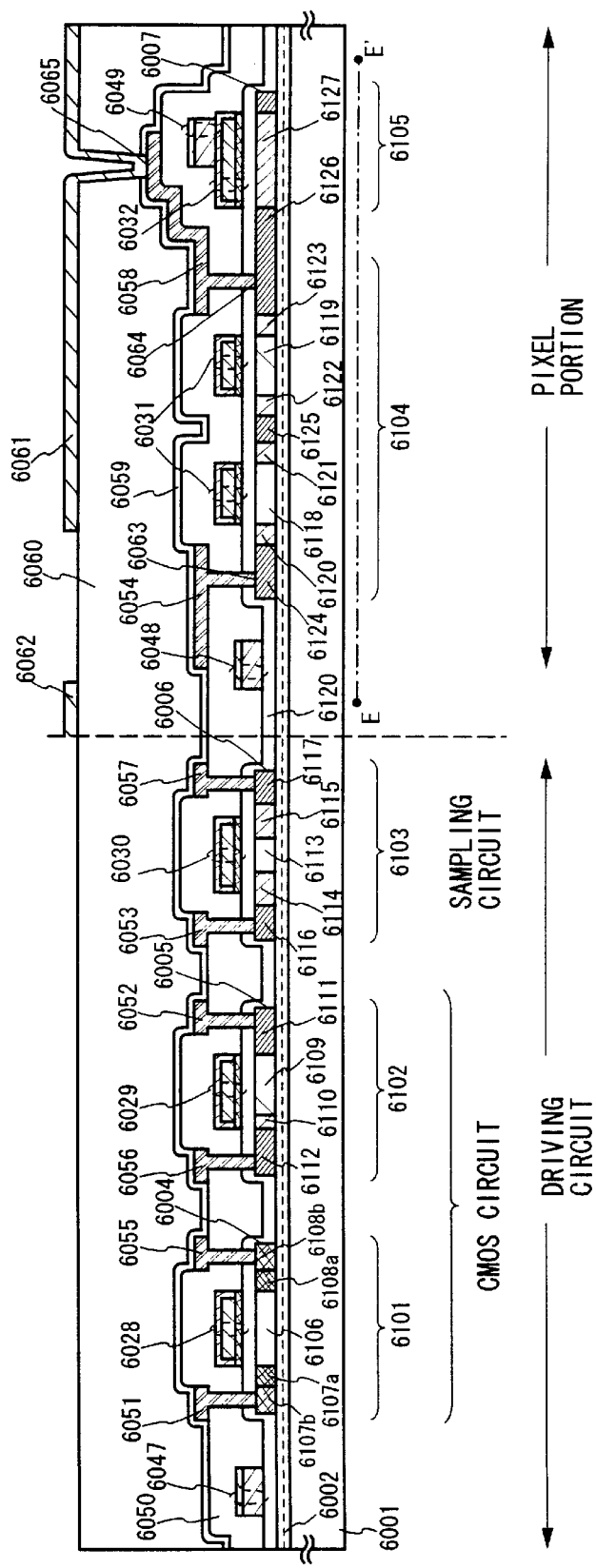
FIG. 12 is a cross-sectional view showing a process of manufacturing a TFT in accordance with the present invention.

Thereafter, a second interlayer insulating film 6060 comprised of an organic resin is formed to a thickness of 1.0 to 1.5 µm. As the organic resin, polyimide, acrylic, polyamide, polyimideamide, BCB (benzocyclobutene), etc., can be used. Here, polyimide of the type that, after applied to the substrate, thermally polymerizes was used; it was fired at 300° C, whereby the second interlayer dielectric film was formed. Then, a contact hole reaching the drain wiring 6058 was formed in the second interlayer insulating film 6060, and pixel electrodes 6061 and 6062 were formed. The pixel electrodes can be formed by using a transparent conductive film in the case a transmission type liquid crystal panel is to be obtained, while, in the case a reflection type liquid crystal panel is to be fabricated, the pixel electrodes can be formed by a metal film. In this embodiment, a transmission type liquid crystal panel is to be fabricated, so that an indium tin oxide (ITO) film was formed to a thickness of 100 nm by sputtering. (FIG. 12)

In this way, a substrate having the TFTs of the driving circuit and the pixel TFTs of the pixel portion on the same substrate could be completed. In the driving circuit, there were formed a p-channel TFT 6101, a first n-channel TFT 6102 and a second n-channel TFT 6103, while, in the pixel portion, there were formed a pixel TFT 6104 and a storage capacitor 6105. In this specification, such a substrate is called active matrix substrate for convenience.

The p-channel TFT 6101 in the driving circuit has a channel-forming region 6106, source regions 6107a and 6107b and drain regions 6108a and 6108b in the island semiconductor layer 6004. The first n-channel TFT 6102 has a channel-forming region 6109, an LDD region 6110 overlapping the gate electrode 6029 (such an LDD region will hereinafter be referred to as Lov), a source region 6111 and a drain region 6112 in the island semiconductor layer 6005. The length in the channel direction of this Lov region is set to 0.5 to 3.0 µm, preferably 1.0 to 1.5 µm. A second n-channel TFT 6103 has a channel-forming region 6113, LDD regions 6114 and 6115, a source region 6116 and a drain region 6117 in the island semiconductor layer 6006. In these LDD regions, there are formed an Lov region and an LDD region which does not overlap the gate electrode 6030(such an LDD region will hereafter be referred as Loff); and the length in the channel direction of this Loff region is 0.3 to 2.0 µm, preferably 0.5 to 1.5 µm. The pixel TFT 6104 has channel-forming regions 6118 and 6119, Loff regions 6120 to 6123, and source or drain regions 6124 to 6126 in the island semiconductor layer 6007. The length in the channel direction of the Loff regions is 0.5 to 3.0 µm, preferably 1.5 to 2.5 µm. Further, the storage capacitor 6105 comprises capacitor wirings 6032 and 6049, an insulating film composed of the same material as the gate insulating film and a semiconductor layer 6127 which is connected to the drain region 6126 of the pixel TFT 6104 and in which an impurity element for imparting the n conductivity type is added. In FIG. 12, the pixel TFT 6104 is of the double gate structure, but may be of the single gate structure, or may be of a multi-gate structure in which a plurality of gate electrodes are provided.

Thus a substrate which comprises driver circuit TFTs and pixel TFTs of the pixel portion over a same substrate is can be completed. The p-channel TFT 6101, the first n-channel TFT 6102 and the second n-channel TFT 6103 are formed in the driver circuit and the pixel TFT 6104 and the storage capacitor 6105 are formed in the pixel portion. (FIG. 12) In this Specification such a substrate is referred to as a TFT substrate for the sake of convenience.

Next a process for manufacturing a liquid crystal panel from the TFT substrate manufactured through the above stated processes are described.

An alignment film 6070 is formed on the TFT substrate of the state of FIG. 12. In this Embodiment polyimide was used for the alignment film 6070. (FIG. 13A) An opposing substrate is then prepared. The opposing substrate comprises a glass substrate 6075, a color filter 6074, an opposing electrode 6073 comprising transparent conductive film and an alignment film 6072. Note that the color of the color filter 6074 is characterized as being in correspondence to each pixel of the pixel portion.

Note that in this embodiment a polyimide film that orients liquid crystal molecules in parallel with respect to the substrate was used as the alignment film 6070. The liquid crystal molecules are made to orient in parallel having a prescribed pre-tilt angle by performing rubbing treatment after forming the alignment film.

Figures 13A, 13B:
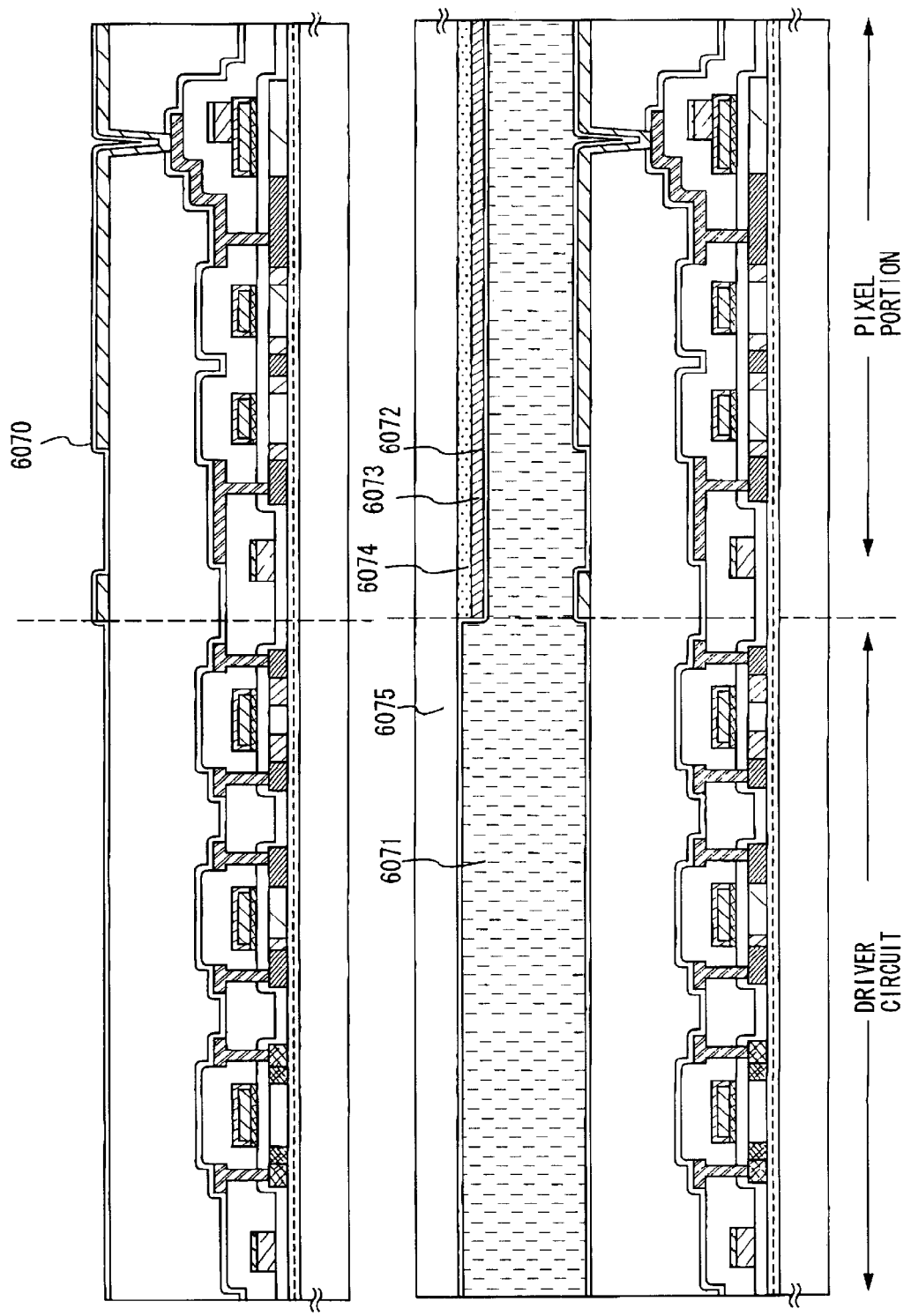
FIGS. 13A and 13B are cross-sectional views showing a process of manufacturing a TFT in accordance with the present invention.
Figure 14:
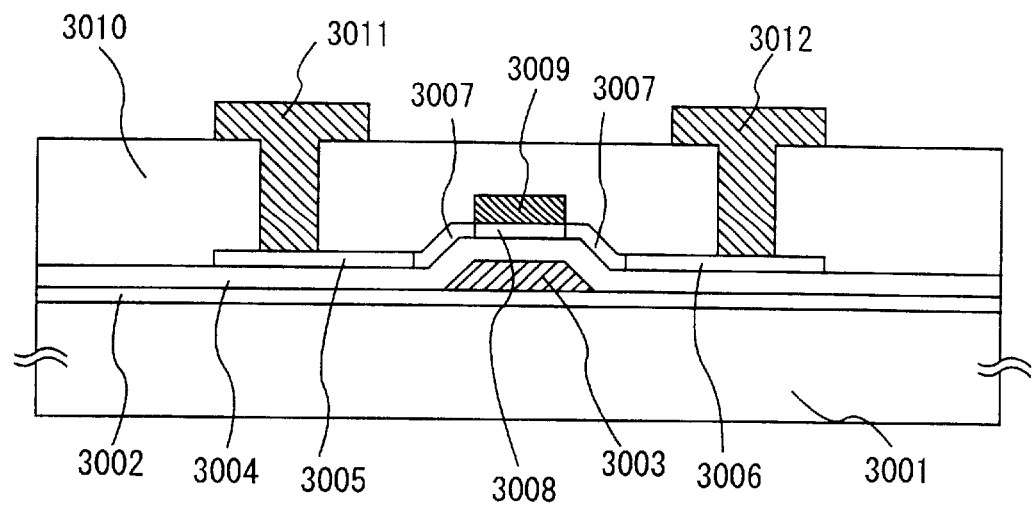
FIG. 14 is a cross-sectional view showing the structure of a TFT in accordance with the present invention.

The TFT substrate which went through the above stated processes and the opposing substrate are next stuck together through a sealant and spacers (neither shown in the figure) by a known cell assembly process. Thereafter, liquid crystal is injected between the two substrates and completely sealed by a sealant (not shown). A reflection type liquid crystal panel as shown in FIG. 14 is thus complete. (FIG. 13B)

As described above, in this embodiment, the structure of the TFTs constituting the respective circuits can be optimized in accordance with the specifications required by the pixel TFTs and the driving circuits; and thus, the operating performance and the reliability of the semiconductor device can be enhanced. Further, since the gate electrodes are formed of a conductive material that has heat resistance, the activation of the LDD regions, the source regions and the drain regions can be easily realized, and, by forming the gate wirings of a low resistance material, the wiring resistance can be sufficiently lowered. Accordingly, the gate electrodes can be applied even to a display device in which the diagonal screen size of the pixel portion is in the 4-inch class or greater.

Embodiment 5

In this embodiment, an example in which the inverse-stagger type TFTs are employed in the liquid crystal panel of the present invention will be described.

Refer to FIG. 14. FIG. 14 shows a cross-sectional view of the inverse-stagger type n-channel TFT that constitutes the liquid crystal panel according to this embodiment. Although FIG. 14 shows only one n-channel TFT, it is needless to say that a CMOS circuit can be structured by a p-channel TFT and an n-channel TFT. Also, it is needless to say that the pixel TFT can be structured by the same structure.

Reference numeral 3001 denotes a substrate as which the substrate described in the Embodiment 4 is employed. Reference numeral 3002 denotes a silicon oxide film. Reference numeral 3003 denotes a gate electrode. Reference numeral 3004 denotes a gate insulating film. Reference numeral 3005, 3006, 3007 and 3008 denote active layers each formed of a polycrystal silicon film. In the manufacture of the active layer, the same method as the polycrystallization of an amorphous silicon film described in the Embodiment 4 is applied. Alternatively, there may be applied a method of crystallizing the amorphous silicon film by a laser beam (preferably a linear laser beam or a facial laser beam). Reference numeral 3005 denotes a source region, reference numeral 3006 denotes a drain region, reference numeral 3007 denotes a low-density impurity region (LDD region), and reference numeral 3008 denotes a channel formation region. Reference numeral 3009 denotes a channel protective film, and reference numeral 3010 denotes an interlayer insulating film. Reference numeral 3011 and 3012 denote a source wiring and a drain wiring, respectively.

Subsequently, referring to FIG. 15, a case in which the liquid crystal panel is structured by the inverse-stagger TFT different in structure from that shown in Fi2. 14 will be described.

Figure 15:
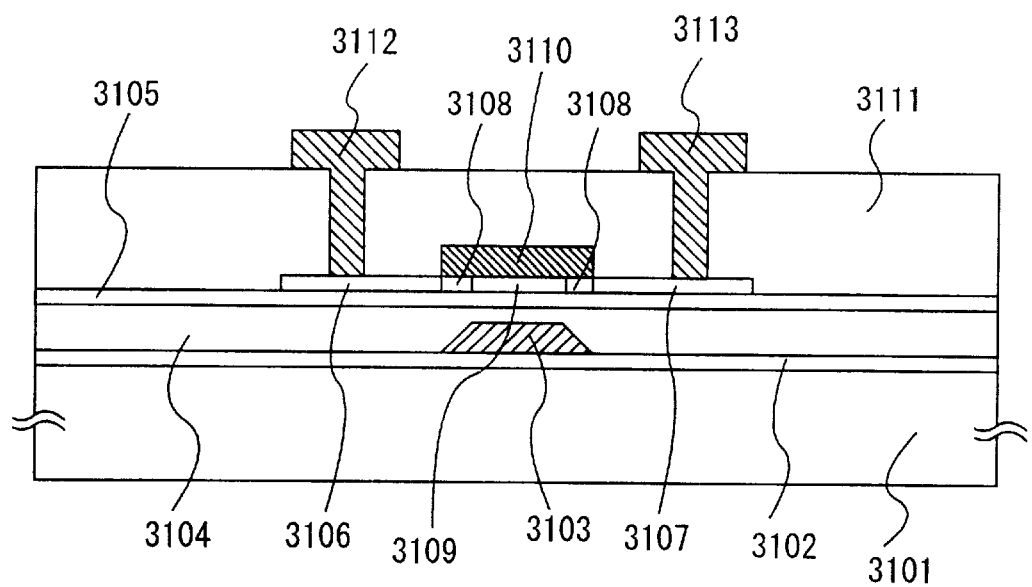
FIG. 15 is a cross-sectional view showing the structure of a TFT in accordance with the present invention.

Similarly, although FIG. 15 shows only one n-channel TFT, it is needless to say that a CMOS circuit can be structured by a p-channel TFT and an n-channel TFT. Also, it is needless to say that the pixel TFT can be structured by the same structure.

Reference numeral 3101 denotes a substrate. Reference numeral 3102 denotes a silicon oxide film. Reference numeral 3103 denotes a gate electrode. Reference numeral 3104 denotes a benzodichlobutene (BCB) film a top surface of which is flattened. Reference numeral 3105 denotes silicon nitride film. The BCB film 3104 and the silicon nitride film 3105 constitute a gate insulating film. Reference numeral 3106,3107,3108 and 3109 denote active layers each formed of a polycrystal silicon film. In the manufacture of the active layer, the same method as the polycrystallization of an amorphous silicon film described in the Embodiment 4 is applied. Alternatively, there may be applied a method of crystallizing the amorphous silicon film by a laser beam (preferably a linear laser beam or a facial laser beam). Reference numeral 3106 denotes a source region, reference numeral 3107 denotes a drain region, reference numeral 3108 denotes a low-density impurity region (LDD region) and 3109 denotes a channel formation region. Reference numeral 3110 denotes a channel protective film and reference numeral 3111 denotes an interlayer insulating film. Reference numeral 3112 and 3113 denote a source wiring and a drain wiring, respectively.

In this embodiment, since the gate insulating film formed of the BCB film and the silicon nitride film are flattened, the amorphous silicon film formed thereon becomes also flattened. As a result, when the amorphous silicon film is polycrystallized, the polycrystal silicon film more uniform than the conventional inverse-stagger type TFT can be obtained.

Embodiment 6

It is possible to use a variety of liquid crystals other than TN liquid crystals in a liquid crystal panel of the invention. For example, the liquid crystal materials disclosed in: Furue, H, et al., "Characteristics and Driving Scheme of Polymer-stabilized Monostable FLCD Exhibiting Fast Response Time and High Contrast Ratio with Gray-scale Capability," SID, 1998; in Yoshida, T., et al., "A Full-color Thresholdless Antiferroelectric LCD Exhibiting Wide Viewing Angle with Fast Response Time," SID 97 Digest, 841 , 1997; S. Inui et al., "Thresholdless antiferroelectricity in Liquid Crystals and its Application to Displays", J. Mater. Chem. 6 (4), 671–673, 1996; and in U.S. Pat. No. 5,594,569 can be used.

A liquid crystal that shows antiferroelectric phase in a certain temperature range is called an antiferroelectric liquid crystal. Among a mixed liquid crystal comprising antiferroelectric liquid crystal, there is one called thresholdless antiferroelectric mixed liquid crystal that shows electrooptical response characteristic in which transmittivity is continuously varied against electric field. Among the thresholdless antiferroelectric liquid crystals, there are some that show V-shaped electrooptical response characteristic, and even liquid crystals whose driving voltage is approximately ±2.5 V (cell thickness approximately 1 $\mu$m to 2 $\mu$m) are found.

Figure 16:
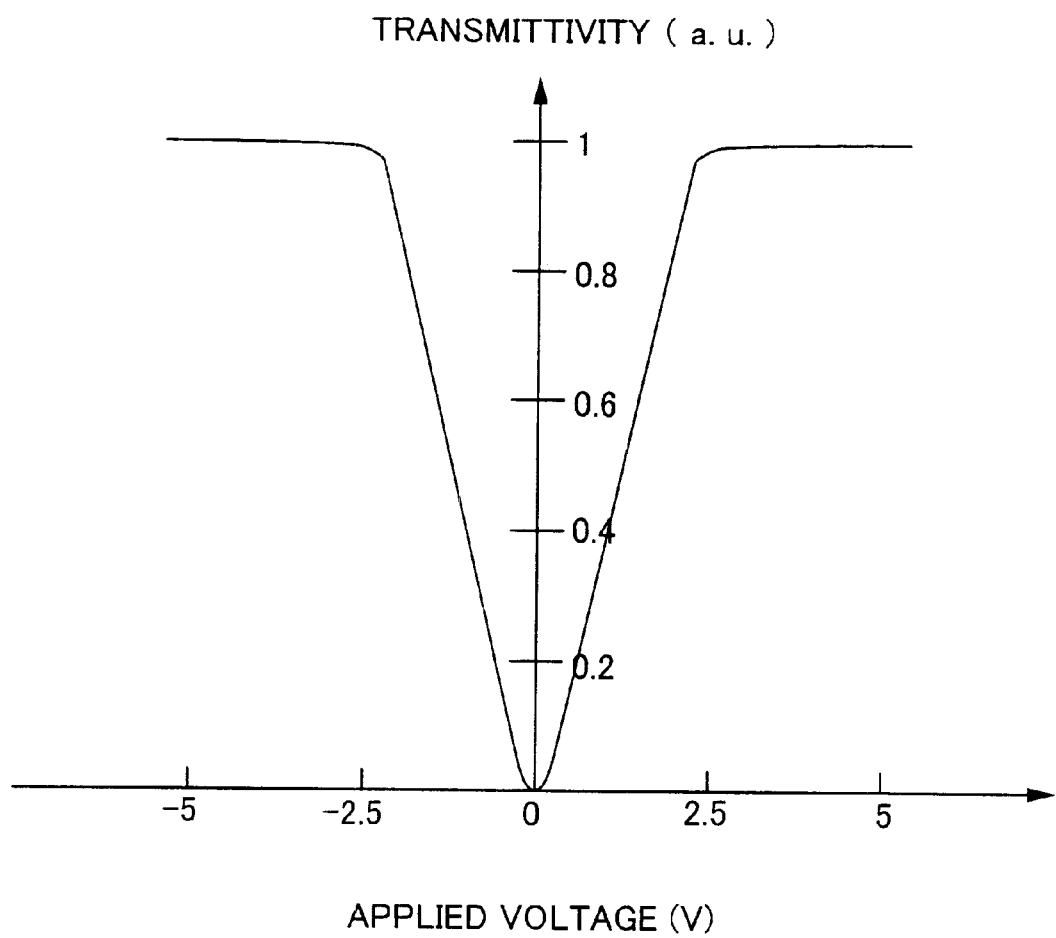
FIG. 16 is a graph representing the characteristic of the light transmittance to a supply voltage of a non-threshold value antiferroelectric mixture liquid crystal.

An example of light transmittivity characteristic against the applied voltage of thresholdless antiferroelectric mixed liquid crystal showing V-shaped electro-optical response characteristic, is shown in FIG. 16. The axis of ordinate in the graph shown in FIG. 16 is transmittivity (arbitrary unit) and the axis of the abscissas is the applied voltage. The transmitting direction of the polarizer on light incident side of the liquid crystal display is set at approximately parallel to direction of a normal line of the smectic layer of thresholdless antiferroelectric liquid crystal that approximately coincides with the rubbing direction of the liquid crystal display device. Further, the transmitting direction of the polarizer on the light radiating side is set at approximately right angles (crossed Nicols) against the transmitting direction of the polarizer on the light incident side.

As shown in FIG. 16, it is shown that low voltage driving and gray scale display is available by using such thresholdless antiferroelectric mixed liquid crystal.

It becomes possible to reduce the power supply voltage of the sampling circuit for the image signal to for example approximately 5 to 8 V in case of using such low voltage driving thresholdless antiferroelectric mixed liquid crystal to a liquid crystal panel having an analog driver. Accordingly the operation power supply voltage for the driver can be reduced and low consumption electricity and high reliability of the liquid crystal panel can be attained.

Further, also in the case of using the low voltage driving thresholdless antiferroelectric mixed liquid crystal to a liquid crystal panel having a digital driver, the operation power supply voltage of the D/A converter circuit can be lowered because the output voltage of the D/A converter circuit can be lowered, and the operation power voltage of the driver can be lowered. Accordingly, low consumption electricity and high reliability of the liquid crystal panel can be attained.

Therefore the use of such low voltage driving thresholdless antiferrelectric mixed liquid crystal is effective in case of using a TFT having a relatively small LDD region (low concentration impurity region) width (for instance 0 to 500 nm, or 0 to 200 nm).

Further, thresholdless antiferroelectric mixed liquid crystal has large spontaneous polarization in general, and the dielectric constant of the liquid crystal itself is large. Therefore, comparatively large storage capacitor is required in the pixel in case of using thresholdless antiferroelectric mixed liquid crystal for a liquid crystal panel. It is therefore preferable to use thresholdless antiferroelectric mixed liquid crystal having small spontaneous polarity. It is also acceptable to compensate a small storage capacitor by lengthening a writing period of gray scale voltage to the pixel (pixel field period) by applying line sequential driving method as the driving method of the liquid crystal panel.

A low consumption electricity of a liquid crystal panel is attained because low voltage driving is realized by the use of such thresholdless antiferroelectric mixed liquid crystal.

Further, any of liquid crystal display can be used as a display medium of the liquid crystal panels of the present invention on condition that the liquid crystal has an electro-optical characteristic shown in FIG. 16.

Embodiment 7

Figure 17:
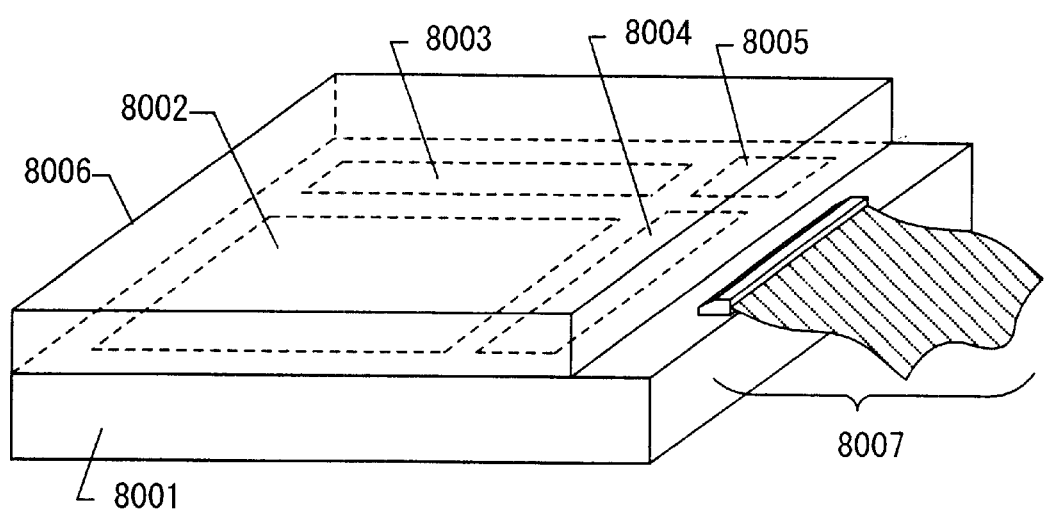
FIG. 17 is an apparent view showing a liquid crystal panel in accordance with the present invention.
Figures 19A, 19B:
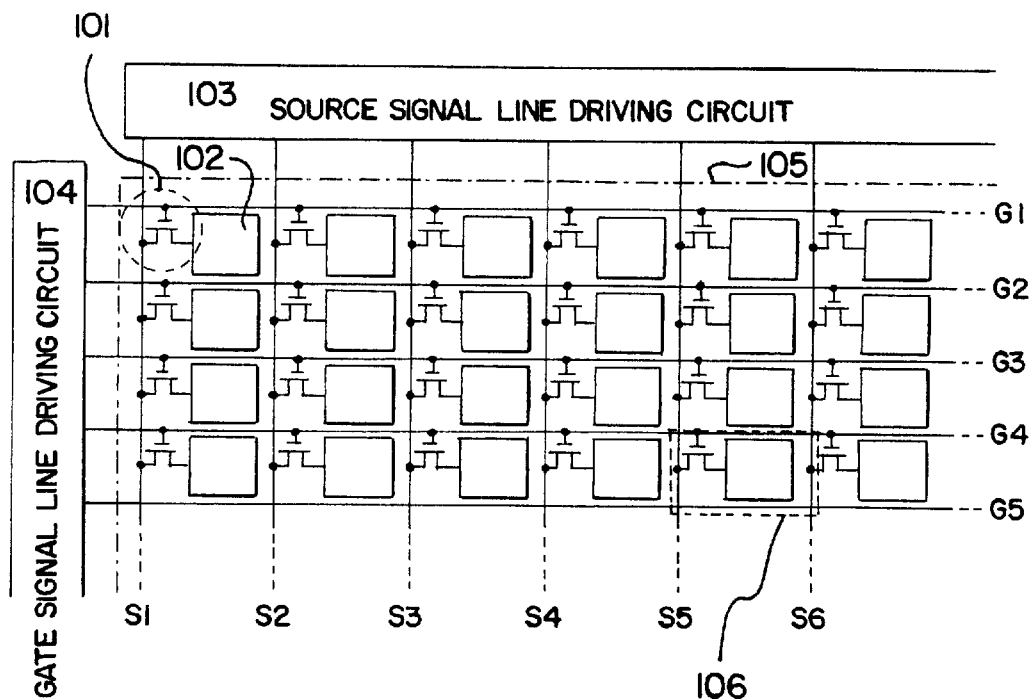
FIGS. 19A and 19B are diagrams showing a top view of the TFT substrate and a display pattern.
Figure 21:
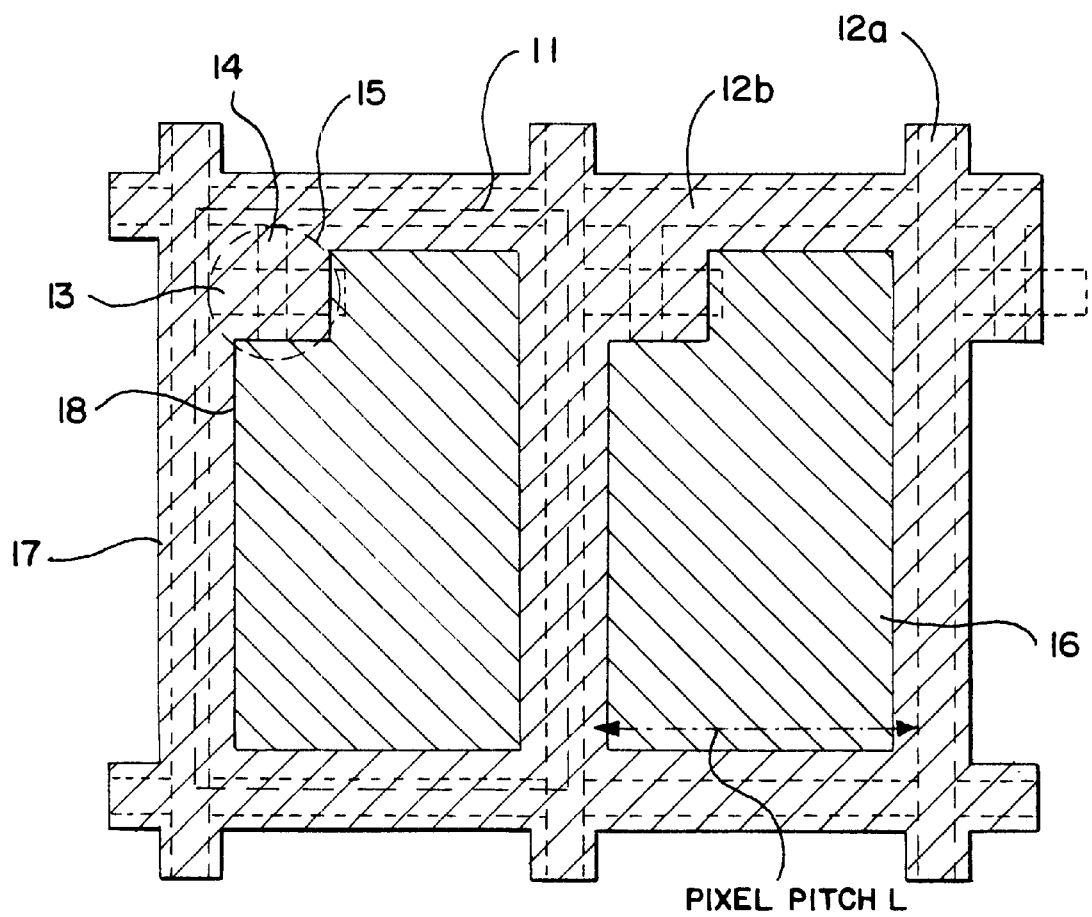
FIG. 21 is an enlarged view of a pixel portion.
Figure 23:
FIG. 23 is a diagram showing the polarity pattern of a frame inverse driving method.
Figure 24:
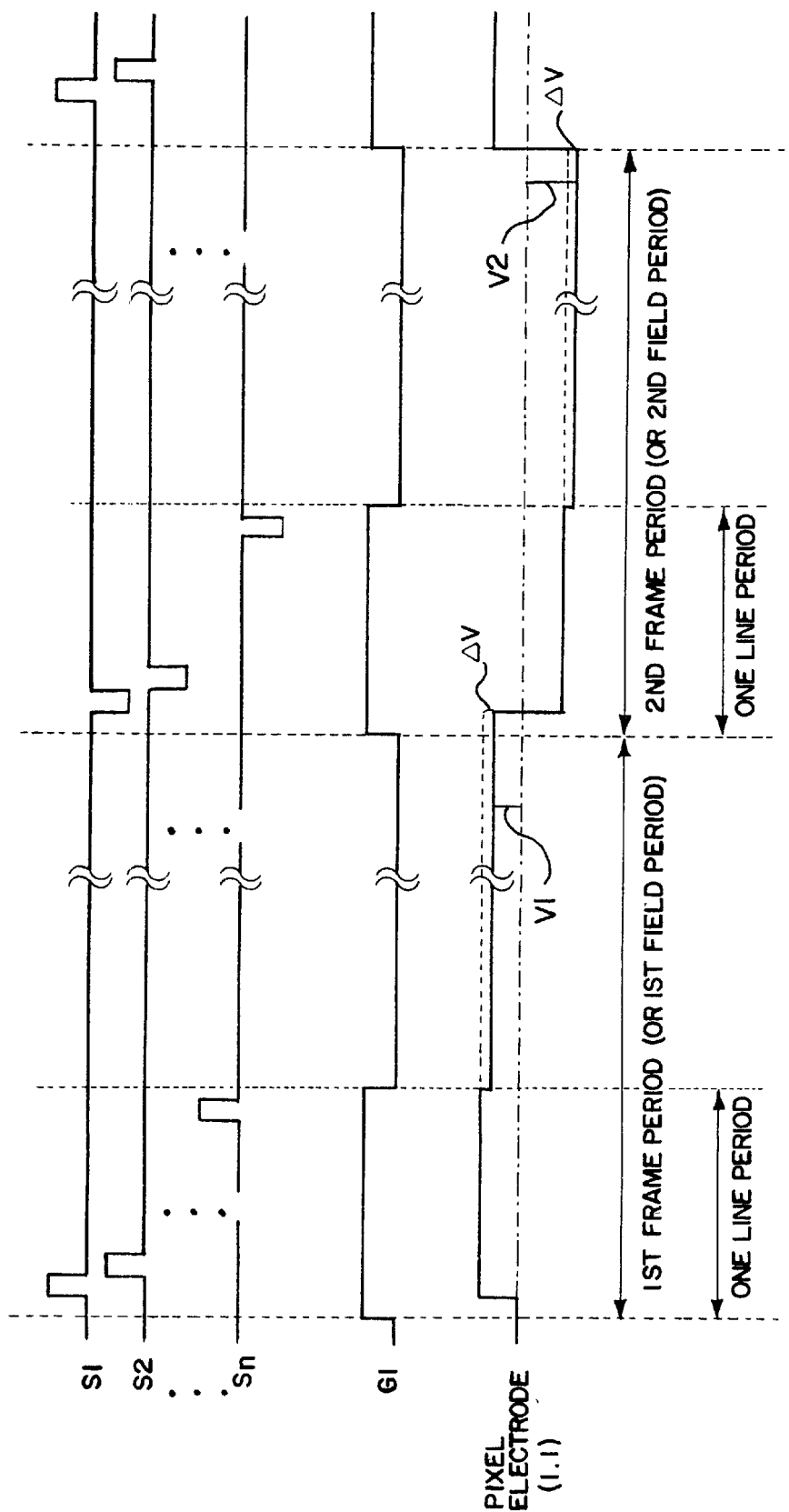
FIG. 24 is a timing chart of a conventional liquid crystal panel.

FIG. 17 shows an example in which a liquid crystal panel is structured by using a TFT substrate with the structure shown in the Embodiments 1 to 5. FIG. 17 shows a portion corresponding to the main body of the liquid crystal panel which is also called "liquid crystal panel".

Referring to FIG. 17, reference numeral 8001 denotes a TFT substrate on which a plurality of TFTs are formed. Those TFTs constitute, on the substrate, a pixel portion 8002, a gate signal line driving circuit 8003, a source signal line driving circuit 8004 and a logic circuit 8005. A counter substrate 8006 is stuck onto the above TFT substrate. A liquid crystal layer (not shown) is interposed between the TFT substrate and the counter substrate 8006.

Also, in the structure shown in FIG. 17, it is desirable that the side surfaces of the TFT substrate 8001 and the side surfaces of the counter substrate 8006 are made identical with each other except for one side. With this arrangement, the number of substrates yielded from a large-sized substrate can be efficiently increased. Also, in the above-described one side, a part of the TFT substrate 8001 is exposed by removing a part of the counter substrate 8006, and an FPC (flexible print circuit) 8007 is fitted to the exposed portion. An IC chip (a semiconductor circuit made up of a MOSFET formed on a monocrystal silicon) may be mounted on that exposed portion as occasion demands.

Because the TFT formed through the manufacturing process shown in the Embodiment 4 or the Embodiment 5 has an extremely high operating speed, a signal processing circuit driven at a high frequency of several hundreds MHz to several GHz can be formed integrally with the pixel portion on the same substrate. In other words, the liquid crystal panel shown in FIG. 17 embodies a system on panel.

Embodiment 8

CMOS circuits and pixel matrix circuits manufactured by implementing the present invention can be used for various electro-optical devices (active matrix liquid crystal panels). Namely the present invention can be applied to all those electronic appliances that incorporate such an electro-optical device as the display medium.

Examples of the electronic appliances include a video camera, a digital camera, a projector (rear type or front type), a head mounted display (a goggle type display), a game machine, a car navigation system, a personal computer and a portable information terminal (a mobile computer, a cellular telephone, an electronic book). FIG. 18A to 18F show examples of these.

FIG. 18A shows a personal computer, which comprises: a main body 7001; an image input section 7002; a display device 7003; and a keyboard 7004. The present invention can be applied to the image input section 7002 and the display device 7003.

FIG. 18B shows a video camera, which comprises: a main body 7101; a display device 7102; a sound input section 7103; an operation switch 7104; a battery 7105; and an image receiving section 7106. The present invention can be applied to the display device 7102 and the sound input section 7103.

FIG. 18C shows a mobile computer, which comprises: a main body 7201: a camera section 7202; an image receiving section 7203; an operation switch 7204; and a display device 7205. The present invention can be applied to the display device 7205.

FIG. 18D shows a goggle type display, which comprises: a main body 7301: a display device 7302; and an arm section 7303. The present invention can be applied to the display device 7302.

FIG. 18E shows a player that uses a recording medium storing a program (hereinafter called the "recording medium"). It comprises a main body 7401, a display device 7402, a speaker unit 7403, a recording medium 7404 and an operation switch 7405. Note that by using DVD (digital versatile disc), CD, etc., as a recording medium of this device, music appreciation, film appreciation, games or the use for Internet can be performed. The present invention can be applied to the display device 7402.

FIG. 18F shows a game machine, which comprise: a main body 7501; a display device for the main body 7502; a display device 7503; a recording medium 7504; a controller 7505; a sensor unit for the main body 7506; a sensor unit 7507; and a CPU unit 7508. Each of the sensor unit for the main body 7506 and the sensor unit 7507 is capable of sensing the infrared ray emitted from the controller 7505 and the main body 7501. The present invention can be applied to the display device for the main body 7502 and the display device 7503.

As described above, the applicable range of the present invention is very large, and it can be applied to electronic appliances of various fields. Further the electronic appliances of the present Embodiment can be realized by using constitution of any combination of Embodiments 1 to 7.

As was described above, according to the present invention, the frame frequency is set to 120 Hz or more, and the liquid crystal panel is driven through the frame inverse driving method. Also, each of the pixels is arranged to correspond to one of R, G and B of the color filters disposed on the TFT substrate side. With the above structure, display bright in contrast can be obtained without discrination and flicker in the display device of the direct vision type whose pixel pitches are short to 20 $\mu$m or less.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A display device, comprising:
    at least one driver circuit comprising a plurality of driver TFTs formed over a substrate;
    a pixel portion comprising a plurality of pixel TFTs, a plurality of gate signal lines, a plurality of source signal lines, and a plurality of pixel electrodes formed over the substrate, the pixel TFTs and the pixel electrodes disposed on the respective portions where the gate signal lines and the source signal lines cross each other,
    wherein each n-channel TFT of the driver TFTs has at least one LDD region (low-density imparity region) overlapping with a gate electrode thereof, and each of the pixel TFTs has LDD regions not overlapping with a gate electrode thereof,
    wherein first video signals of the same polarity are supplied to said plurality of pixel electrodes through said plurality of source signal lines during a first frame period, wherein second video signals of the polarity opposite to that of said first video signal are supplied to said plurality of pixel electrodes through said plurality of source signal lines during a second frame period subsequent to said first frame period, and wherein a length of said first frame period and said second frame period is set to 8.3 msec or less.

2. A device according to claim 1, wherein intervals of said plurality of gate signal lines or said plurality of source signal lines are set to 20 μm or less.

3. A device according to claim 1, further comprising a second substrate having color filters of three colors.

4. A device according to claim 3, wherein each of said plurality of pixel electrodes corresponds to one of the three colors of said color filters.

5. A device according to claim 3, wherein liquid crystal is disposed between said substrate and said second substrate.

6. A goggle type display having a said display device according to claim 1.

7. A goggle type display having two display device according to claim 1.

8. A mobile computer having a display device according to claim 1.

9. A notebook type personal computer having a display device according to claim 1.

10. A video camera having a display device according to claim 1.

11. A DVD player having a display device according to claim 1.

12. A game machine having a display device according to claim 1.

13. A display device, comprising:
at least one driver circuit comprising a plurality of driver TFTs formed over a substrate;
a pixel portion comprising a plurality of pixel TFTs, a plurality of gate signal lines, a plurality of source signal lines, and a plurality of pixel electrodes formed over the substrate, the pixel TFTs and the pixel electrodes disposed on the respective portions where the gate signal lines and the source signal lines cross each other,
wherein each n-channel TFT of the driver TFTs has at least one LDD region (low-density imparity region) overlapping with a gate electrode thereof, and each of the pixel TFTs has LDD regions not overlapping with a gate electrode thereof,
wherein video signals of the same polarity are supplied to said plurality of pixel electrodes through said plurality of source signal lines,
wherein said polarity of said video signals changes for each one-frame period, and
wherein a length of said one-frame period is set to 8.3 msec or less.

14. A device according to claim 13, wherein intervals of said plurality of gate signal lines or said plurality of source signal lines are set to 20 μm or less.

15. A device according to claim 13, further comprising a second substrate having color filters of three colors.

16. A device according to claim 15, wherein each of said plurality of pixel electrodes corresponds to one of the three colors of said color filters.

17. A device according to claim 15, wherein liquid crystal is disposed between said substrate and said second substrate.

18. A goggle type display having a said display device according to claim 13.

19. A goggle type display having two display device according to claim 13.

20. A mobile computer having a display device according to claim 13.

21. A notebook type personal computer having a display device according to claim 13.

22. A video camera having a display device according to claim 13.

23. A DVD player having a display device according to claim 13.

24. A game machine having a display device according to claim 13.

25. A display device, comprising:
at least one driver circuit comprising a plurality of driver TFTs formed over a substrate;
a pixel portion comprising a plurality of pixel TFTs, a plurality of gate signal lines, a plurality of source signal lines, and a plurality of pixel electrodes formed over the substrate, the pixel TFTs and the pixel electrodes disposed on the respective portions where the gate signal lines and the source signal lines cross each other,
wherein each n-channel TFT of the driver TFTs has at least one LDD region (low-density imparity region) overlapping with a gate electrode thereof, and each of the pixel TFTs has LDD regions not overlapping with a gate electrode thereof,
wherein video signals of the same polarity are supplied to said plurality of switching elements through said plurality of source signal lines,
wherein select signals which select said video signals are supplied to said plurality of switching elements through said plurality of gate signal lines,
wherein video signals selected by said select signals are supplied to said plurality of pixel electrodes through said plurality of switching elements,
wherein said polarity of said video signal changes for each one-frame period, and
wherein a length of said one-frame period is set to 8.3 msec or less.

26. A device according to claim 25, wherein intervals of said plurality of gate signal lines or said plurality of source signal lines are set to 20 μm or less.

27. A device according to claim 25,
wherein one of said gate signal lines is connected to said gate electrode of the pixel TFT, and
wherein any one of said source signal lines is connected to one of source and drain regions of the pixel TFT.

28. A device according to claim 25, further comprising a second substrate having color filters of three colors.

29. A device according to claim 28, wherein each of said plurality of pixel electrodes corresponds to one of the three colors of said color filters.

30. A device according to claim 28, wherein liquid crystal is disposed between said substrate and said second substrate.

31. A goggle type display having a said display device according to claim 25.

32. A goggle type display having two display device according to claim 25.

33. A mobile computer having a display device according to claim 25.

34. A notebook type personal computer having a display device according to claim 25.

35. A video camera having a display device according to claim 25.

36. A DVD player having a display device according to claim 25.

37. A game machine having a display device according to claim 25.

38. A display device, comprising:

at least one driver circuit comprising a plurality of driver TFTs formed over a substrate;

a pixel portion comprising a plurality of pixel TFTs, a plurality of gate signal lines, a plurality of source signal lines, and a plurality of pixel electrodes formed over the substrate, the pixel TFTs and the pixel electrodes disposed on the respective portions where the gate signal lines and the source signal lines cross each other, wherein each n-channel TFT of the driver TFTs has at least one LDD region (low-density imparity region) overlapping with a gate electrode thereof, and each of the pixel TFTs has LDD regions not overlapping with a gate electrode thereof, wherein video signals of the same polarity are supplied to said plurality of pixel electrodes through said plurality of source signal lines, wherein said polarity of said video signals changes for each one-frame period, and wherein a frame frequency is set to 120 Hz or more.

39. A device according to claim 38, wherein intervals of said plurality of gate signal lines or said plurality of source signal lines are set to 20 µm or less.

40. A device according to claim 38, further comprising a second substrate having color filters of three colors.

* * * * *